(12) United States Patent
You et al.

(10) Patent No.: US 11,996,406 B2
(45) Date of Patent: May 28, 2024

(54) SEMICONDUCTOR DEVICES HAVING REFLECTIVE SYMMETRY

(71) Applicant: Samsung Electronics Co., Ltd., Suwon-si (KR)

(72) Inventors: Junggun You, Ansan-si (KR); Sungil Park, Suwon-si (KR); Joohee Jung, Seoul (KR); Sunggi Hur, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/148,233

(22) Filed: Dec. 29, 2022

(65) Prior Publication Data

US 2023/0139447 A1  May 4, 2023

Related U.S. Application Data

(63) Continuation of application No. 17/180,989, filed on Feb. 22, 2021, now Pat. No. 11,545,489.

(30) Foreign Application Priority Data

Jul. 17, 2020 (KR) ................ 10-2020-0088637

(51) Int. Cl.
*H01L 27/088* (2006.01)
*H01L 21/762* (2006.01)
(Continued)

(52) U.S. Cl.
CPC .... *H01L 27/088* (2013.01); *H01L 21/823456* (2013.01); *H01L 21/823481* (2013.01)

(58) Field of Classification Search
CPC . H01L 21/762; H01L 21/76224–76237; H01L 21/823481; H01L 21/823878; H01L 29/0649–0653; H01L 27/088; H01L 21/823431; H01L 29/0673; H01L 29/42392; H01L 29/78696; H01L 21/823456; H01L 21/823437;
(Continued)

(56) References Cited

U.S. PATENT DOCUMENTS 9,620,590 B1  4/2017 Bergendahl et al.
9,929,160 B1  3/2018 Lee et al.
(Continued)

*Primary Examiner* — Sonya McCall-Shepard
(74) *Attorney, Agent, or Firm* — HARNESS, DICKEY & PIERCE, P.L.C.

(57) ABSTRACT

A semiconductor device includes a substrate including first and second active regions extending in a first direction and isolated from direct contact with each other in the first direction; a device isolation layer between the first and second active regions in the substrate; and first and second gate structures extending in a second direction on the substrate while respectively intersecting end portions of the first and second active regions. The first gate structure includes a first gate electrode. The second gate structure includes a second gate electrode. The first gate structure protrudes further toward the device isolation layer, as compared to the second gate structure, in a vertical direction that is perpendicular to the first and second directions, and a lower end of the first gate electrode is located on a lower height level than a lower end of the second gate electrode.

20 Claims, 20 Drawing Sheets

(51) Int. Cl.
  *H01L 21/768* (2006.01)
  *H01L 21/8234* (2006.01)
  *H01L 29/06* (2006.01)
  *H01L 29/423* (2006.01)
  *H01L 29/786* (2006.01)

(58) Field of Classification Search
  CPC ....... H01L 21/82345; H01L 21/823828; H01L 21/823842; H01L 21/82385; H01L 21/823462; H01L 21/823857; H01L 21/823468; H01L 21/823864; H01L 29/7846; H01L 27/0924; H01L 21/823807; H01L 21/823821; H01L 29/42356; H01L 29/66348; H01L 29/4236; H01L 29/7855
  See application file for complete search history.

(56) References Cited

U.S. PATENT DOCUMENTS

| | | |
|---|---|---|
| 9,972,701 B2 | 5/2018 | Kim et al. |
| 10,332,965 B2 | 6/2019 | Holland et al. |
| 10,566,331 B1 | 2/2020 | Yang et al. |
| 2010/0301390 A1 | 12/2010 | Ko et al. |
| 2013/0270512 A1 | 10/2013 | Radosavljevic et al. |
| 2014/0056060 A1 | 2/2014 | Khvalkovskiy et al. |
| 2017/0104061 A1 | 4/2017 | Peng et al. |
| 2018/0122704 A1 | 5/2018 | Zhou |
| 2019/0386099 A1* | 12/2019 | Kim .................... H01L 29/7851 |
| 2020/0066725 A1 | 2/2020 | Bhuwalka et al. |

* cited by examiner

SEMICONDUCTOR DEVICES HAVING REFLECTIVE SYMMETRY

CROSS-REFERENCE TO RELATED APPLICATIONS

This application is a continuation of U.S. patent application Ser. No. 17/180,989, filed on Feb. 22, 2021, which claims benefit of priority, under 35 U.S.C. § 119, to Korean Patent Application No. 10-2020-0088637, filed on Jul. 17, 2020 in the Korean Intellectual Property Office, the disclosure of each of which is incorporated herein by reference in its entirety.

BACKGROUND

The present disclosure relates to semiconductor devices.

As demand for high performance, high speed, multifunctionality, and the like, in semiconductor devices increases, a degree of integration of semiconductor devices is increasing. In manufacturing a semiconductor device having a fine pattern corresponding to the trend of a high degree of integration of the semiconductor device, patterns having a fine width or a fine spacing distance may be implemented. In addition, in order to overcome limitations of operation characteristics due to a reduction in a size of a planar metal oxide semiconductor FET (MOSFET), efforts are being made to develop semiconductor devices including a FinFET having a three-dimensional channel.

SUMMARY

An aspect of the present inventive concepts is to provide semiconductor devices having improved reliability.

According to some example embodiments, a semiconductor device may include a substrate including first and second active regions extending in a first direction and isolated from direct contact with each other in the first direction. The semiconductor device may include a device isolation layer in a trench region of the substrate between the first and second active regions, and including a liner layer and an isolation insulating layer, the liner layer between an inner wall that at least partially defines the trench region and the isolation insulating layer. The semiconductor device may include a plurality of channel layers on the first and second active region, respectively, and isolated from direct contact with each other in a vertical direction perpendicular to the first direction. The semiconductor device may include gate structures extending in a second direction on the substrate and intersecting the first and second active regions and the plurality of channel layers. Each of the gate structures may include a gate electrode surrounding the plurality of channel layers. The second direction may be different from the first direction. The first direction and the second direction may both be parallel to an upper surface of the substrate. The semiconductor device may include source/drain regions on the first and second active regions on at least one side of each of the gate structures, and contacting the plurality of channel layers. The semiconductor device may include contact plugs connected to the source/drain regions. The gate structures may include first and second gate structures respectively intersecting end portions of the first and second active regions contacting the device isolation layer, the first gate structure including a first gate electrode, the second gate structure including a second gate electrode. The first gate structure and the second gate structure may have an asymmetrical disposition with respect to the device isolation layer, such that first gate structure and the second gate structure do not have reflective symmetry with respect to each other in the first direction.

According to some example embodiments, a semiconductor device may include a substrate including first and second active regions extending in a first direction and isolated from direct contact with each other in the first direction, a device isolation layer between the first and second active regions in the substrate, and first and second gate structures extending in a second direction on the substrate while respectively intersecting end portions of the first and second active regions. The first gate structure may include a first gate electrode. The second gate structure may include a second gate electrode. The second direction may be different from the first direction. The first direction and the second direction may both be parallel to an upper surface of the substrate. The first gate structure may protrude further toward the device isolation layer as compared to the second gate structure in a vertical direction that is perpendicular to the first and second directions, and a lower end of the first gate electrode may be located on a lower height level than a lower end of the second gate electrode.

According to some example embodiments, a semiconductor device may include a substrate including first and second active regions extending in a first direction and isolated from direct contact with each other in the first direction, a device isolation layer between the first and second active regions in the substrate, the device isolation layer including a liner layer and an isolation insulating layer, sequentially stacked, gate structures extending in a second direction on the substrate and intersecting the first and second active regions, and source/drain regions on the first and second active regions on at least one side of each of the gate structures. The gate structures may include a first gate structure intersecting an end portion of the first active region contacting the device isolation layer and including a first gate electrode, a second gate structure intersecting an end portion of the second active region contacting the device isolation layer and including a second gate electrode, and a third gate structure isolated from direct contact with the device isolation layer and including a third gate electrode. The first gate structure may have a shape, different from shapes of the second and third gate structures, and the second gate electrode may have a width, different from a width of the third gate electrode in the first direction.

BRIEF DESCRIPTION OF THE DRAWINGS

The above and other aspects, features, and advantages of the present inventive concepts will be more clearly understood from the following detailed description, taken in conjunction with the accompanying drawings, in which.

DETAILED DESCRIPTION

Figure 1:
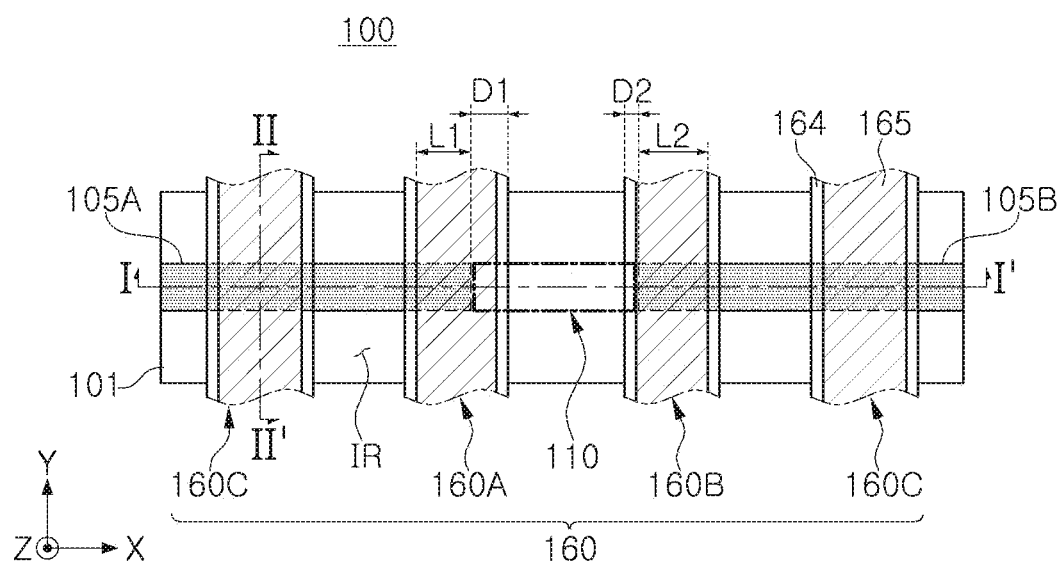
FIG. 1 is a plan view illustrating a semiconductor device according to some example embodiments.

Hereinafter, example embodiments of the present disclosure will be described with reference to the accompanying drawings.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances.

Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As described herein, an element that is "on" another element may be above, beneath, and/or horizontally adjacent to the other element. Additionally, an element that is "on" another element may be directly on the other element such that the elements are in direct contact with each other or may be indirectly on the other element such that the elements are isolated from direct contact with each other.

FIG. 1 is a plan view illustrating a semiconductor device according to some example embodiments.

Figure 2A:
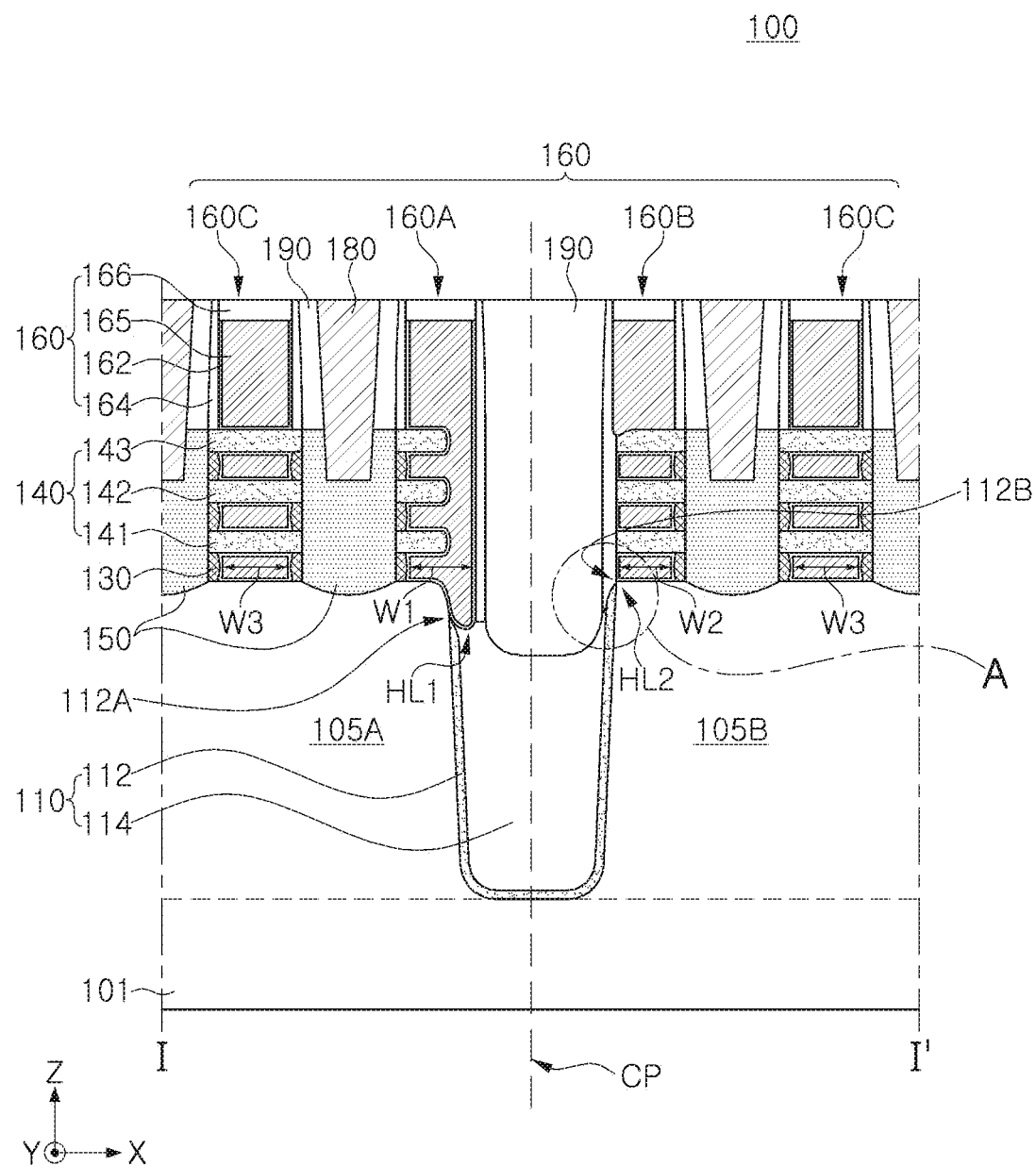
FIGS. 2A and 2B are cross-sectional views illustrating a semiconductor device according to some example embodiments.
Figure 2B:
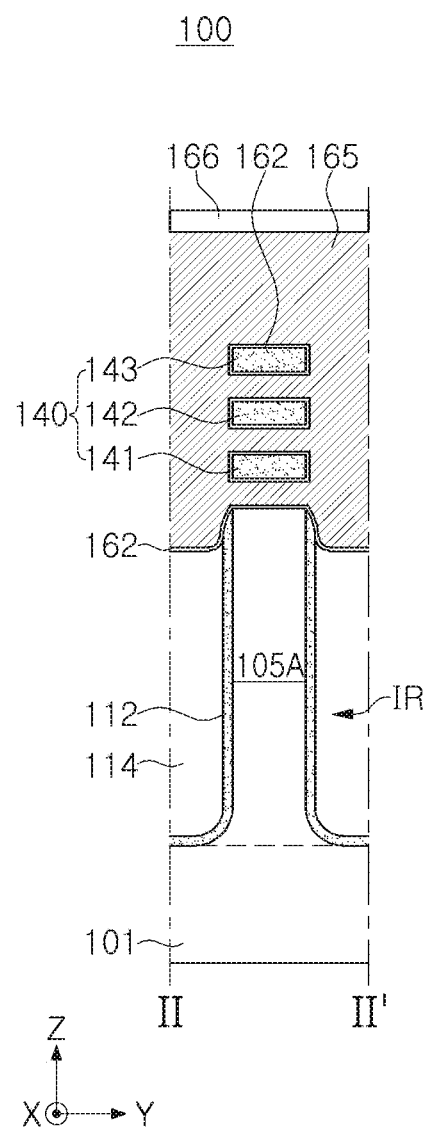

FIGS. 2A and 2B are cross-sectional views illustrating a semiconductor device according to some example embodiments. FIGS. 2A and 2B are cross-sectional views of the semiconductor device of FIG. 1 taken along cut lines I-I' and II-II. For convenience of description, only major components of a semiconductor device are illustrated in FIGS. 1, 2A, and 2B.

Figure 3:
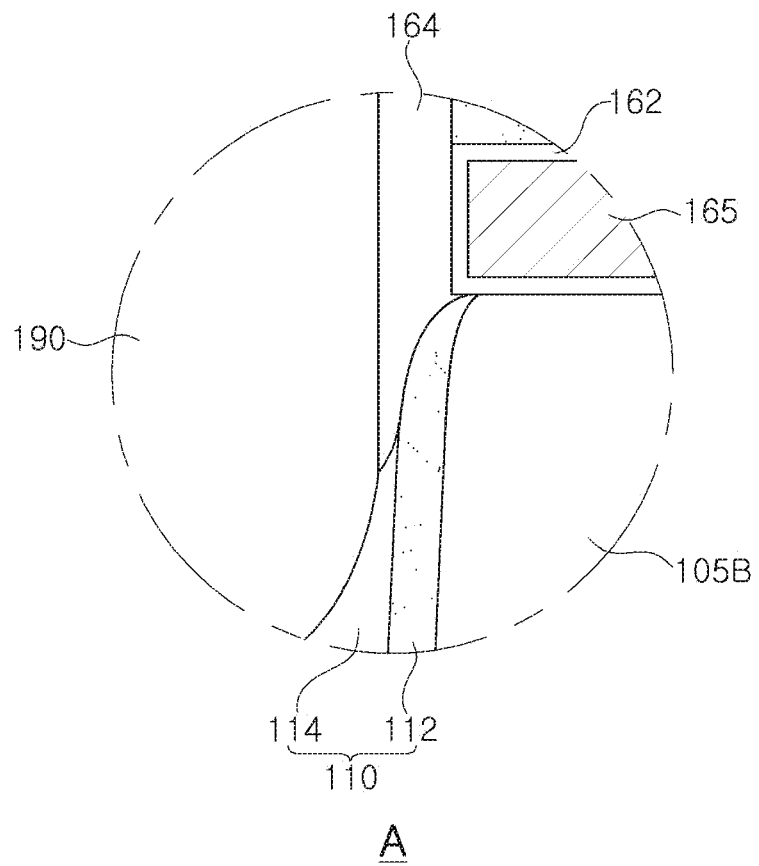
FIG. 3 is a partially enlarged view illustrating a portion of a semiconductor device according to some example embodiments.

FIG. 3 is a partially enlarged view illustrating a portion of a semiconductor device according to some example embodiments. FIG. 3 is an enlarged view illustrating portion 'A' of FIG. 2A.

Referring to FIGS. 1 to 3, a semiconductor device 100 may include a substrate 101, first and second active regions 105A and 105B on the substrate 101 (e.g., on, including being direct on, the upper surface of the substrate 101), channel structures 140 including a plurality of channel layers 141, 142, and 143 arranged perpendicularly to the first and second active regions 105A and 105B, respectively, and spaced apart from each other, gate structures 160 intersecting the first and second active regions 105A and 105B and extending in a direction (e.g., the y direction, also referred to herein as a second direction), source/drain regions 150 contacting the plurality of channel layers 141, 142, and 143, and contact plugs 180 connected to the source/drain regions 150. The semiconductor device 100 may further include a device isolation region IR including a device isolation layer 110, internal spacer layers 130, and an interlayer insulating layer 190. The gate structures 160 may include a gate dielectric layer 162, a gate electrode 165, gate spacer layers 164, and a gate capping layer 166, respectively.

It will be understood that elements described herein to be "spaced apart" from each other may be interchangeably referred to as being isolated from direct contact with each other (e.g., by one or more interposing structures and/or spaces).

As shown in at least FIGS. 1-2A, in the semiconductor device 100, the first and second active regions 105A and 105B may each extend in a first direction (e.g., the x direction), for example such that the length of each of the first and second active regions 105A and 105B in the first direction (e.g., x direction, is greater than the length of the first and second active regions 105A and 105B in a perpendicular direction (e.g., the y direction). The first direction (e.g., x direction) and a second direction (e.g., y direction) may each be parallel to an upper surface of the substrate 101. The first and second active regions 105A and 105B may be spaced apart from each other (e.g., isolated from direct contact with each other) in the same first direction (e.g., the x direction). In the semiconductor device 100, the first and second active regions 105A and 105B may have a fin structure, and the gate electrode 165 may be disposed between the first and second active regions 105A and 105B and the channel structures 140, between the plurality of channel layers 141, 142, and 143 of the channel structures 140, and on the channel structure 140. Therefore, the semiconductor device 100 may include a transistor having a multi-bridge channel field effect transistor (MBCFET) structure, which may be a gate-all-around type field effect transistor.

The substrate 101 may have an upper surface extending in x and y directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The device isolation region IR may define the first and second active regions 105A and 105B in the substrate 101. The device isolation region IR may be formed by, for example, a shallow trench isolation (STI) process. According to some example embodiments, the device isolation region IR may further include a region having a step difference in a lower portion of the substrate 101 and extending deeper thereinto. The device isolation region IR may expose upper surfaces of the first and second active regions 105A and 105B, and may partially expose upper portions of the first and second active regions 105A and 105B. In some example embodiments, the device isolation region IR may have a curved upper surface to have a higher height level, as the device isolation region IR is adjacent to the first and second active regions 105A and 105B.

The device isolation region IR may include a liner layer 112 and an isolation insulating layer 114. The liner layer 112 may be located along an inner wall of a trench in which the device isolation region IR is located, and may have a relatively thin thickness, as compared to the isolation insulating layer 114. The liner layer 112 may be, for example, a layer for curing an exposed surface of the substrate 101 (which may include an exposed portion of the upper surface of the substrate 101) after the trench is formed. The liner layer 112 may include an insulating material different from the isolation insulating layer 114, and may include, for example, silicon nitride or silicon oxynitride. The isolation insulating layer 114 may be stacked on the liner layer 112, and may be disposed to fill the trench. The trench may be referred to as a trench region of the substrate 101, such that the inner wall may be understood to at least partially define the trench region. In some example embodiments, the exposed surface of the substrate 101 may define at least a portion of the inner wall. As a result, the device isolation layer 110 may be understood to be in a trench region of the substrate 101 (e.g., in trench as defined at least in part by the inner wall and in some example embodiments further defined by the exposed surface) between the first and second active regions 105A and 105B, where the device isolation layer includes the liner layer 112 and the isolation insulating layer 114, where the liner layer 112 and the isolation insulating layer 114 are sequentially stacked, for example as shown in FIGS. 2A and 2B, such that the liner layer 112 may be between (e.g., directly between and directly contact each of) the inner wall and the isolation insulating layer 114. The isolation insulating layer 114 may include, for example, a silicon oxide.

The device isolation layer 110 may refer to a region of the device isolation region IR. As illustrated in FIG. 1, the device isolation layer 110 may refer to a region of the device isolation region IR located between the first and second active regions 105A and 105B (e.g., between the first and second active regions 105A and 105B in the substrate 101). For example, the device isolation layer 110 may refer to a region located between the first and second active regions 105A and 105B in a direction in which the first and second active regions 105A and 105B extend, for example, in the x direction. The device isolation layer 110 may electrically isolate the first and second active regions 105A and 105B from direct contact with each other.

The device isolation layer 110 may have an asymmetrical disposition with respect to a center along the x direction, for example such that the device isolation layer 110 does not have reflectional symmetry (also referred to as line symmetry, reflective symmetry, or mirror symmetry) in the x direction, and/or does not have reflectional symmetry across a y-z plane CP extending through the device isolation layer 110 at a position in the x direction that is between (e.g., equidistant in the x direction between) the first and second active layers 105A and 105B. The y-z plane CP may be understood to extend through, and thus represent the center along the x direction, of the device isolation layer 110. Specifically, in the device isolation layer 110, both upper end portions of the liner layer 112 may be located on different height levels. As shown in FIG. 2A, for example, an upper end portion of the liner layer 112 adjacent to a second gate structure 160B (second end portion 112B) may be located on a higher height level (e.g., height distance in the z direction from the substrate 101 and/or upper surface of the substrate 101) than an upper end portion of the liner layer 112 adjacent to a first gate structure 160A (first end portion 112A). Accordingly, both (e.g., opposite) end portions of the liner layer 112 in the x direction may be located on different height levels. This shape may be formed according to asymmetrical dispositions of the first and second gate structures 160A and 160B in an upper portion of the liner layer 112, which will be described below.

As illustrated in the enlarged view of FIG. 3, a corner of the second active region 105B contacting the end portion of the liner layer 112 may have a rounded shape. This shape may be formed according to, for example, a process of forming the liner layer 112. The liner layer 112 may have a shape such that a lateral surface of the liner layer 112 contacting the isolation insulating layer 114 is obliquely extended and connected to an upper surface of the liner layer 112, to reduce a width of the liner layer 112 as being closer to the end portion of the liner layer 112. For example, the liner layer 112 may have an upper surface inclined toward the second active region 105B in the second end portion 112B. The liner layer 112 may have a similar shape in an end portion on the other side contacting the first active region 105A (e.g., first end portion 112A), but is not limited thereto. For example, as shown in FIG. 2A, one end portion of the liner layer (e.g., one of the first or second end portions 112A or 112B) has an upper surface inclined toward the first or second active region 105A or 105B. Additionally, as shown in FIGS. 2A and 3, at least one active region of the first active region 105A or the second active region 105B, contacting one end portion of the liner layer 112, may have a rounded corner.

The first and second active regions 105A and 105B may be defined by the device isolation region IR in the substrate 101, and may be disposed to extend in a first direction, for example, in the x direction. The first and second active regions 105A and 105B may be disposed to be spaced apart from each other and side by side, with the device isolation layer 110 interposed therebetween, in the x direction.

The first and second active regions 105A and 105B may have a structure protruding from the substrate 101. According to some example embodiments, upper ends of the first and second active regions 105A and 105B may be disposed to protrude from the upper surface of the device isolation layer 110 to a predetermined height. For example, in FIG. 2B, the liner layer 112 may be disposed to cover a lateral surface of the first active region 105A, but an arrangement of the liner layer 112 is not limited thereto. For example, the liner layer 112 may be located to partially expose the lateral surface of the first active region 105A. Further, according to some example embodiments, corners of an upper end of the first active region 105A illustrated in FIG. 2B may also have rounded shapes.

The first and second active regions 105A and 105B may be formed as a portion of the substrate 101, or may include an epitaxial layer grown from the substrate 101. On both sides of the gate structures 160, the first and second active regions 105A and 105B on the substrate 101 may be partially recessed, and the source/drain regions 150 may be disposed on the recessed first and second active regions 105A and 105B. In some example embodiments, the first and second active regions 105A and 105B may include impurities.

The channel structures 140 may include the first to third channel layers 141, 142, and 143, which may be a plurality of, e.g., two or more channel layers arranged to be spaced apart from each other, in a direction, perpendicular to the upper surfaces of the first and second active regions 105A and 105B, for example in a vertical direction perpendicular to the direction in which the first and second active regions 105A and 105B extend, for example, in the z direction on the first and second active regions 105A and 105B. As shown in FIGS. 2A and 2B, the first to third channel layers 141, 142, and 143 may at least partially (or entirely) overlap with each other in the vertical direction (e.g., the z direction), also referred to herein as being at least partially aligned with each other in the vertical direction, and the first to third channel layers 141, 142, and 143 may be isolated from direct contact with each other in the same vertical direction (e.g., z direction). The first to third channel layers 141, 142, and 143 may be connected to the source/drain regions 150 and may be spaced apart from the upper surfaces of the first and second active regions 105A and 105B at the same time. The first to third channel layers 141, 142, and 143 may have the same width as or a width similar to the first and second active regions 105A and 105B in the y direction, and may have the same width as or a width similar to the gate structure 160 in the x direction. According to some example embodiments, the first to third channel layers 141, 142, and 143 may have a reduced width such that lateral surfaces of the first to third channel layers 141, 142, and 143 are located below the gate structure 160 in the x direction.

The first to third channel layers 141, 142, and 143 may be made of a semiconductor material, and may include at least one of silicon (Si), silicon germanium (SiGe), or germanium (Ge). The first to third channel layers 141, 142, and 143 may be made of the same material as the substrate 101, for example. According to some example embodiments, the first to third channel layers 141, 142, and 143 may include an impurity region located in a region adjacent to the source/drain regions 150. The number and shape of the channel layers 141, 142, and 143 constituting a single channel structure 140 may be variously changed in some example embodiments. For example, according to some example embodiments, the channel structure 140 may further include a channel layer disposed on the upper surfaces of the first and second active regions 105A and 105B.

The source/drain regions 150 may be disposed on the first and second active regions 105A and 105B on both sides of the channel structure 140. The source/drain regions 150 may be disposed to cover a lateral surface of each of the first to third channel layers 141, 142, and 143 of the channel structure 140 and the upper surfaces of the first and second active regions 105A and 105B. The source/drain region 150 may be disposed in a region in which upper portions of the first and second active regions 105A and 105B are partially recessed, but in some example embodiments, whether or not a recess is formed and, when present, a depth of the recess may be variously changed. Upper surfaces of the source/drain regions 150 may be located on the same height level or a height level similar to lower surfaces of the gate structures 160, and may be variously changed in some example embodiments. According to some example embodiments, the source/drain regions 150 may be connected to each other or may be merged on two or more active regions adjacent in the y direction, to form a single source/drain region 150.

The source/drain regions 150 may be formed as an epitaxial layer, and may include impurities. For example, the source/drain regions 150 may be a semiconductor layer including silicon (Si) or silicon germanium (SiGe), and may include impurities of different types and/or concentrations depending on regions of the source/drain regions 150.

The gate structures 160 may be disposed on (e.g., directly on) the first and second active regions 105A and 105B and the channel structures 140, to intersect (e.g., overlap in the z direction) the first and second active regions 105A and 105B and the channel structures 140 and may extend in a second direction, for example, in the y direction. As shown, the second direction may be different from (e.g., perpendicular) to the first direction (e.g., x direction) in which the first and second active regions 105A and 105B extend, and both the first and second directions (e.g., x and y directions) may be parallel to the substrate 101 and/or a upper surface of the substrate 101, and the vertical direction (e.g., z direction) may be perpendicular to the first and second directions and/or may be perpendicular to the substrate 101 and/or an upper surface of the substrate 101. Channel regions of transistors may be formed in the first and second active regions 105A and 105B and/or the channel structures 140, intersecting the gate electrode 165 of the gate structure 160.

The gate structures 160 may include first to third gate structures 160A, 160B, and 160C. As illustrated in FIG. 1, the first gate structure 160A may intersect (e.g., overlap in the z direction) an end portion of the first active region 105A adjacent to the second active region 105B, and the second gate structure 160B may intersect (e.g., overlap in the z direction) an end portion of the second active region 105B adjacent to the first active region 105A. The end portions may be in contact with the device isolation layer 110 (e.g., in contact with the device isolation layer 110 in the first direction, or x direction). The third gate structures 160C may be located to be spaced apart from end portions of the first and second active regions 105A and 105B and may be located to be isolated from direct contact with the device isolation layer 110. The first to third gate structures 160A, 160B, and 160C may have different shapes. As shown in FIGS. 2A-2B, the first to third gate structures 160A, 160B, and 160C may each include a gate electrode 165 that surrounds the channel layers 141, 142, and 143, for example at least surrounding the channel layers 141, 142, and 143 in the z direction (e.g., the vertical direction) and the y direction (e.g., the second direction) as shown. For example, as shown in FIG. 2B, a gate electrode 165 of the third gate structure 160C may surround the channel layers 141, 142, and 143 in the z direction and the y direction (e.g., in a y-z plane). As further shown in at least FIGS. 1 and 2A, the source/drain regions 150 are on the first and second active regions 105A and 105B on at least one side of each of the first to third gate structures 160A to 160C, and the source/drain regions 150 are contacting (e.g., in direct contact with) the plurality of channel layers (e.g., channel layers 141, 142, and 143).

The first and second gate structures 160A and 160B may have different widths, intersecting each of the first and second active regions 105A and 105B. For example, the gate electrode 165 of the first gate structure 160A may overlap the first active region 105A (e.g., overlap in the z direction) by a first length L1 in the x direction, and the gate electrode 165 of the second gate structure 160B may overlap the second active region 105B (e.g., overlap in the z direction) by a second length L2, longer than the first length L1 in the x direction. The first length L1 may be, for example, in a range of about 30% to 80% of an entire width of the gate electrode 165 of the first gate structure 160A in the x direction. The first gate structure 160A may protrude from an end portion of the first active region 105A toward the device isolation layer 110 in the x direction by a first distance D1, and the second gate structure 160B may protrude from an end portion of the second active region 105B toward the device isolation layer 110 in the x direction by a second distance D2, shorter than the first distance D1. The first and second gate structures 160A and 160B may be adjacent to the device isolation layer 110. At least a portion of each of the first and second gate structures 160A and 160B may be in contact with the device isolation layer 110.

As illustrated in FIG. 2A, the first gate structure 160A and the second gate structure 160B may have an asymmetrical disposition with respect to the device isolation layer 110, for example such that the first and second gate structures 160A and 160B do not have mirrored shapes in the x direction, have shapes that do not have reflectional symmetry (also referred to as line symmetry, reflective symmetry, mirror symmetry, etc.) with respect to each other in the x direction, and/or have shapes that do not have reflectional symmetry across a y-z plane CP extending through the device isolation layer 110 at a position in the x direction that is between (e.g., equidistant in the x direction between) the first and second active layers 105A and 105B. Restated, the first gate structure 160A, second gate structure 160B and device isolation layer 110 may collectively not have reflective symmetry, for example may not have reflective symmetry across a center in the x direction of the collective device isolation layer 110 and first and second gate structures 160A and 160B, where said center may be represented by the y-z plane CP. The gate electrode 165 of the first gate structure 160A (e.g., a first gate electrode) may have a first width W1 in the x direction (e.g., the first direction), and the gate electrode 165 of the second gate structure 160B (e.g., a second gate electrode) may have a second width W2 in the x direction, the second width W2 being narrower (e.g., smaller in magnitude of width) than the first width W1 in the x direction. The second width W2 may be narrower than a third width W3 of the gate electrode 165 of the third gate structures 160C (e.g., a third gate electrode) in the x direction. Restated, the third width W3 may be wider than the second width W2 in the x direction. The first width W1 may also be narrower than the third width W3, but is not limited thereto. In this case, the 'width' may refer to a maximum width. Relationship between the relative widths of the gate electrodes 165 may be equally applied to widths of the first to third gate structures 160A, 160B, and 160C. As shown in at least FIG. 2A, the first gate structure 160A may have a shape that is different from shapes of the second and third gate structures 160B and 160C.

The gate electrode 165 of the first gate structure 160A may have a first region having a shape similar to a shape of the gate electrode 165 of the third gate structure 160C, and a second region continuously extending from an upper portion of the first gate structure 160A, and the first and second regions may be arranged to be adjacent to each other in the x direction. As shown in FIG. 2A, the first region may include regions that are isolated from direct contact with each other in the z direction with channel layers 141-143 interposed therebetween, and second region continuously extending in the z direction. In the second region, the gate electrode 165 of the first gate structure 160A may have a shape in which regions of the first region that are between the first to third channel layers 141, 142, and 143 and a region of the second region on or above the channel structure 140 are connected to each other. Restated, the gate electrode 165 of the first gate structure 160A may have a shape in which regions between the plurality of channel layers and a second region on the plurality of channel layers are connected to each other in the x direction. In the second region, the gate electrode 165 of the first gate structure 160A may have a region protruding toward the device isolation layer 110 in a downward, or vertical direction (e.g., the z direction). The first gate structure 160A may protrude further toward the device isolation layer 110 in the z direction, as compared to the second gate structure 160B. Therefore, a lower end of the gate electrode 165 of the first gate structure 160A may be located on a first height level HL1, lower than a second height level HL2, which may be a height level of a lower end of the gate electrode 165 of the second gate structure 160B. As referred to herein, a height level may be a distance in the vertical direction (e.g., the z direction) from the substrate 101, for example from the upper surface of the substrate 101.

The second gate structure 160B may have a shape in which a portion of the gate spacer layer 164 and a portion of the gate electrode 165 protrude toward the device isolation layer 110. For example, in an upper portion of the channel structure 140, the gate electrode 165 of the second gate structure 160B may have an inclined lower surface lowering toward the device isolation layer 110.

In the first and second gate structures 160A and 160B, each of the gate spacer layers 164 on one side, adjacent to the device isolation layer 110, may extend along the lateral surfaces of the channel structure 140, may extend in a downward direction, and may be at least partially in contact with the device isolation layer 110. Therefore, the first and second gate structures 160A and 160B may not only have an asymmetrical disposition with respect to each other, but also each may have an asymmetrical disposition with respect to the center in the x direction. Restated, and as shown in at least FIG. 2A, the first gate structure 160A may not have reflective symmetry (e.g., bilateral symmetry, mirror symmetry, line symmetry, etc.) in the x direction, and the second gate structure 160B may not have reflective symmetry (e.g., bilateral symmetry) in the x direction. In the first and second gate structures 160A and 160B, the internal spacer layers 130 may not be disposed on lateral surfaces of the gate electrodes 165 adjacent to the device isolation layer 110.

The semiconductor device 100 may optimize circuit design characteristics by including the first to third gate structures 160A, 160B, and 160C having different shapes as described above. For example, widths of the first and second gate structures 160A and 160B overlapping the first and second active regions 105A and 105B may be controlled to have the above-described shapes, to control characteristics of transistors constituting the semiconductor device 100 according to its purpose.

The gate structure 160 may include a gate electrode 165, a gate dielectric layer 162 between the gate electrode 165 and a plurality of channel layers 141, 142, and 143, a gate spacer layer 164 on lateral surfaces of the gate electrode 165, and a gate capping layer 166 on an upper surface of the gate electrode 165.

The gate dielectric layer 162 may be disposed between the first and second active regions 105A and 105B and the gate electrode 165 and between the channel structure 140 and the gate electrode 165, and may be disposed to cover at least a portion of surfaces of the gate electrode 165. For example, the gate dielectric layer 162 may be disposed to surround all surfaces of the gate electrode 165 except for an uppermost surface of the gate electrode 165. The gate dielectric layer 162 may extend between the gate electrode 165 and the gate spacer layers 164, but is not limited thereto. The gate dielectric layer 162 may include an oxide, a nitride, or a high dielectric constant (high-k) material. The high-k material may refer to a dielectric material having a dielectric constant, higher than a dielectric constant of the silicon oxide ($SiO_2$) The high-k material may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). According to some example embodiments, the gate dielectric layer 162 may be formed as a multilayer film.

The gate electrode 165 may fill between the plurality of channel layers 141, 142, and 143 on the first and second active regions 105A and 105B, and may be disposed to extend onto the channel structure 140. The gate electrode 165 may be spaced apart from the plurality of channel layers 141, 142, and 143 by the gate dielectric layer 162. The gate electrode 165 may include a conductive material, and may include, for example, a metal nitride such as a titanium nitride (TiN), a tantalum nitride (TaN), or a tungsten nitride (WN), and/or a metal material such as aluminum (Al), tungsten (W), molybdenum (Mo), or the like, or a semiconductor material such as doped polysilicon. The gate electrode 165 may be formed as two or more layers.

The gate spacer layers 164 may be disposed on both lateral surface of the gate electrode 165. The gate spacer layers 164 may insulate the source/drain regions 150 and the gate electrodes 165. The gate spacer layers 164 may have a multilayer structure according to some example embodiments. The gate spacer layers 164 may be made of an oxide, a nitride, and an oxynitride, and in particular, may be formed as a low dielectric constant (low-k) film. In the first and second gate structures 160A and 160B, gate spacer layers 164 adjacent to the device isolation layer 110 may have a relatively long length, and may have lower end positions located on a lower height level than other gate spacer layers 164.

The gate capping layer 166 may be disposed on the gate electrode 165, and a lower surface and lateral surfaces of the gate capping layer 166 may be surrounded by the gate electrode 165 and the gate spacer layers 164, respectively.

The internal spacer layers 130 may be disposed in parallel with the gate electrode 165 between the channel structures 140. The gate electrode 165 may be stably spaced from the source/drain regions 150 by the internal spacer layers 130, and may be electrically isolated. The internal spacer layers 130 may have a shape in which lateral surfaces of the internal spacer layers 130 facing the gate electrode 165 may be convexly rounded medially toward the gate electrode 165, but are not limited thereto. The internal spacer layers 130 may be made of an oxide, a nitride, and an oxynitride, and in particular, may be formed as a low-k film. According to some example embodiments, the internal spacer layers 130 may be omitted.

The contact plugs 180 may pass through the interlayer insulating layer 190 to be connected to the source/drain regions 150, and may apply an electric signal to the source/drain regions 150. The contact plugs 180 may have inclined lateral surfaces in which a width of a lower portion becomes narrower than a width of an upper portion according to an aspect ratio, but is not limited thereto. The contact plugs 180 may extend from an upper portion of the semiconductor device 100 to a height level below the third channel layer 143, for example. For example, the contact plugs 180 may extend to a height level corresponding to an upper surface of the second channel layer 142. In some example embodiments, the contact plugs 180 may be disposed to contact the source/drain regions 150 along upper surfaces of the source/drain regions 150 without recessing the source/drain regions 150. The contact plugs 180 may include, for example, a metal nitride such as a titanium nitride (TiN), a tantalum nitride (TaN), or a tungsten nitride (WN), and/or a metal material such as aluminum (Al), tungsten (W), molybdenum (Mo), or the like. In some example embodiments, the contact plugs 180 may further include a barrier metal layer disposed along an outer surface and/or a metal-semiconductor compound layer disposed in a region contacting the source/drain regions 150. The metal-semiconductor compound layer may be, for example, a metal silicide layer.

The interlayer insulating layer 190 may be disposed to cover the source/drain regions 150 and the gate structures 160 and to cover the device isolation layer 110. The interlayer insulating layer 190 may include at least one of an oxide, a nitride, or an oxynitride, and may include, for example, a low dielectric constant material.

Hereinafter, the same description as described above with reference to FIGS. 1 to 3 will be omitted.

Figure 4A:
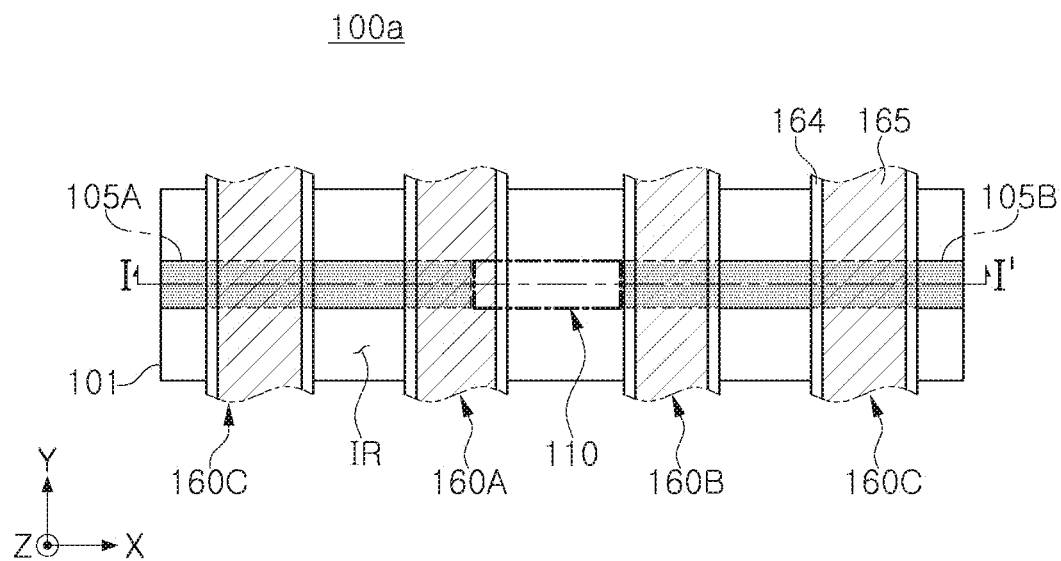
FIGS. 4A and 4B are plan and cross-sectional views illustrating a semiconductor device according to some example embodiments.
Figure 4B:
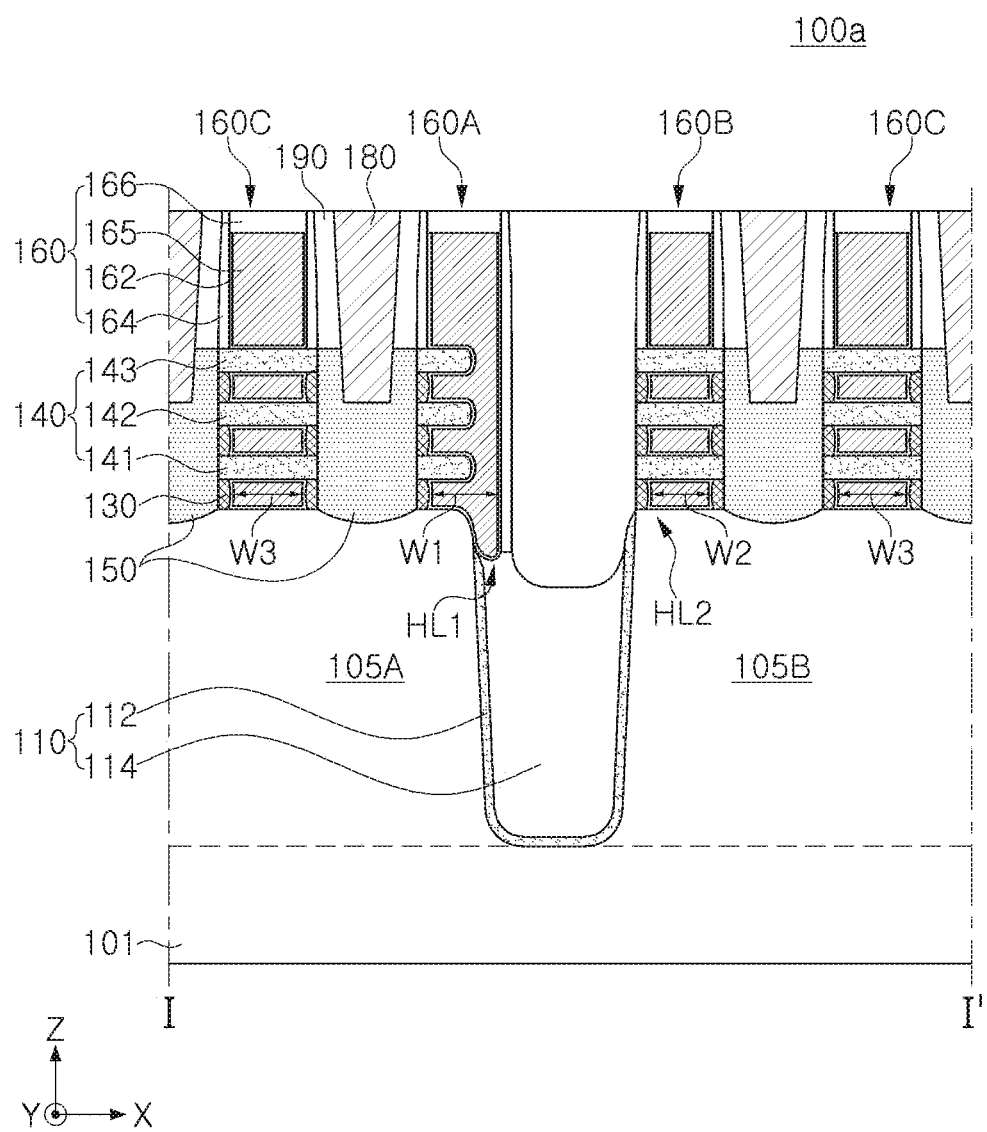

FIGS. 4A and 4B are plan and cross-sectional views illustrating a semiconductor device according to some example embodiments. FIG. 4B illustrates a cross-section along the cut line I-I' of FIG. 4A.

Referring to FIGS. 4A and 4B, in a semiconductor device 100a, one end of a second gate structure 160B may be located on an end portion of a second active region 105B. For example, some example embodiments in which the second distance D2 of FIG. 1 is substantially zero or close to zero are illustrated. Therefore, the second gate structure 160B may not protrude from the end portion of the second active region 105B toward a device isolation layer 110 in the x direction.

In the semiconductor device 100a, a first gate structure 160A may have a shape different from shapes of second and third gate structures 160B and 160C. The second gate structure 160B may have a structure corresponding to the third gate structure 160C. In this case, the expression 'a structure corresponding to . . . ' may refer to a structure in which components of the second gate structure 160B may be arranged in the same shape as or a shape similar to components of the third gate structure 160C in positions corresponding to the components of the third gate structure 160C. For example, a structure of the second gate structure 160B may be similar to a structure of the third gate structure 160C, but, in the x direction, a width of the second gate structure 160B may be narrower than a width of the third gate structure 160C. In the first to third gate structures 160A, 160B, and 160C, a relationship between first to third widths W1, W2, and W3 of the gate electrodes 165 may be the same as described above. According to some example embodiments, the second gate structure 160B may have substantially the same structure and substantially the same size as the third gate structure 160C.

Figure 5:
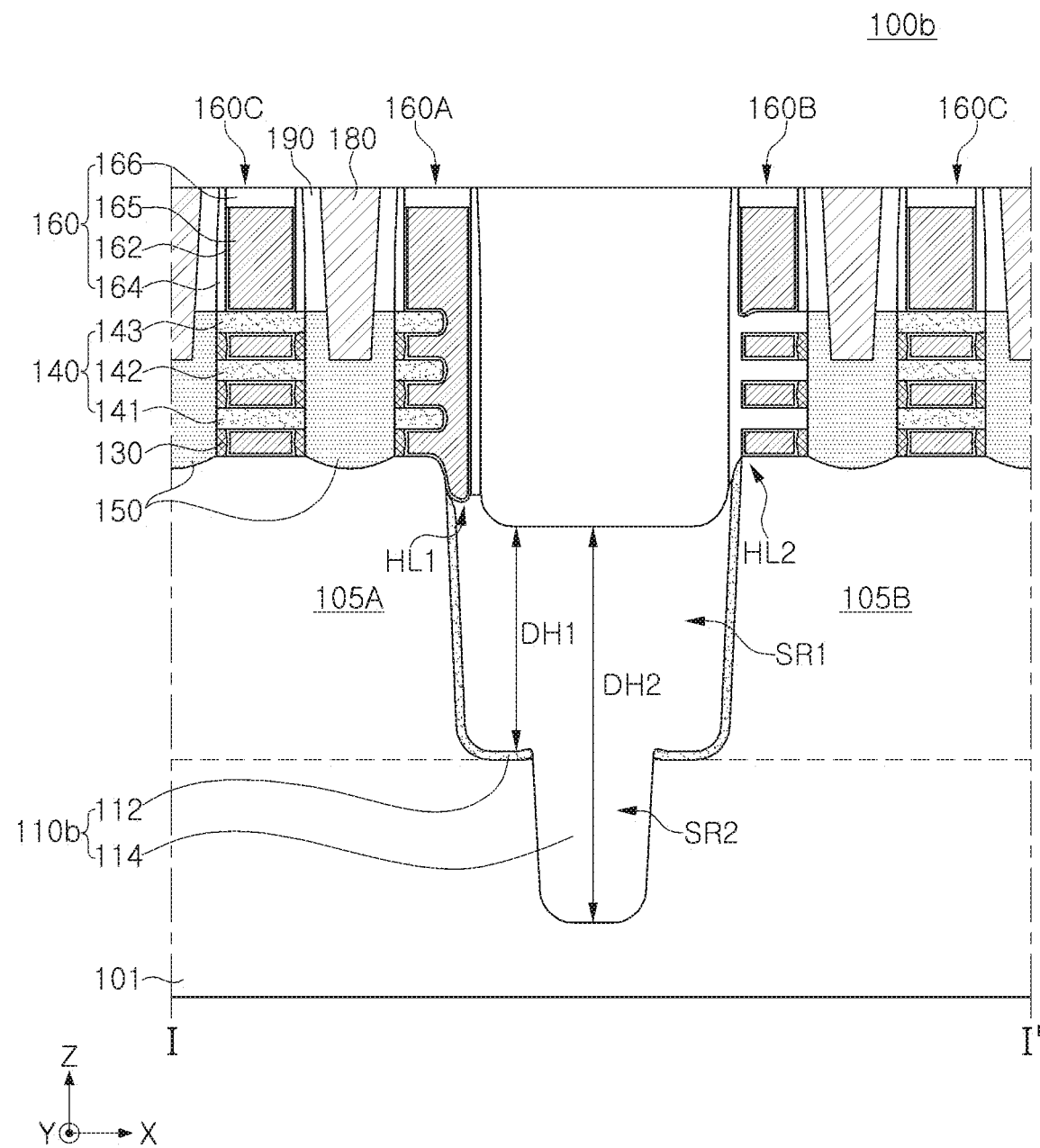
FIGS. 5 and 6 are cross-sectional views illustrating a semiconductor device according to some example embodiments.
Figure 6:
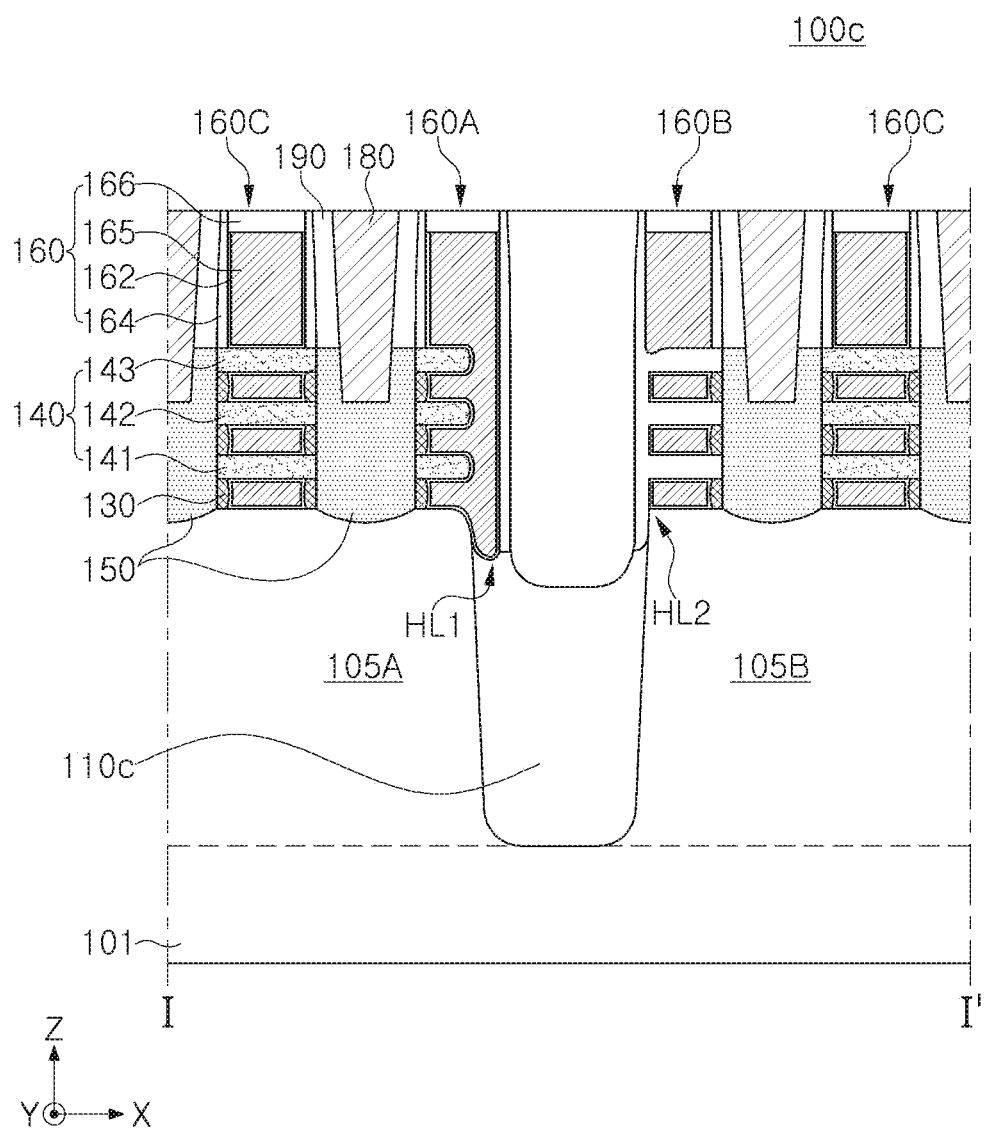

FIGS. 5 and 6 are cross-sectional views illustrating a semiconductor device according to some example embodiments. FIGS. 5 and 6 illustrate cross-sections corresponding to FIG. 2A.

Referring to FIG. 5, in a semiconductor device 100b, a device isolation layer 110b may have first insulating regions SR1 having a first depth SR1D, and a second insulating region SR2 having a second depth SR2D, greater than the first depth, between the first insulating regions SR1.

The second insulating region SR2 may be disposed in a partial region within a device isolation region IR (refer to FIG. 1). The second insulating region SR2 may be formed in a deep trench region between the first insulating regions SR1 to enhance electrical isolation between portions of transistors of the semiconductor device 100b according to an arrangement of the transistors. For example, the second insulating region SR2 may be disposed in a region between PMOS and NMOS.

The second insulating region SR2 may be formed by an additional process after the first insulating regions SR1 is formed. Therefore, even when a liner layer 112 is disposed along sidewalls of the trench of the first insulating regions SR1, the liner layer 112 may not be disposed in the second insulating region SR2 as illustrated. Restated, in the device isolation layer 110, the liner layer 112 may be located only in the first insulating regions SR1 without extending to the second insulating region SR2. At a boundary between the first insulating region SR1 and the second insulating region SR2, an end portion of the liner layer 112 may have a shape protruding in an upward direction, but is not limited thereto.

Referring to FIG. 6, in a semiconductor device 100c, a device isolation layer 110c may not include a liner layer 112. Therefore, the device isolation layer 110c may be formed as a single insulating material layer. In this case, height levels of both end portions of the device isolation layer 110c may be the same or similar, and may be various changed according to a length of a gate electrode 165 extending from a first gate structure 160A in a downward direction.

As such, a structure of the device isolation layer 110c from which the liner layer 112 is omitted may be applied to other example embodiments.

Figure 7A:
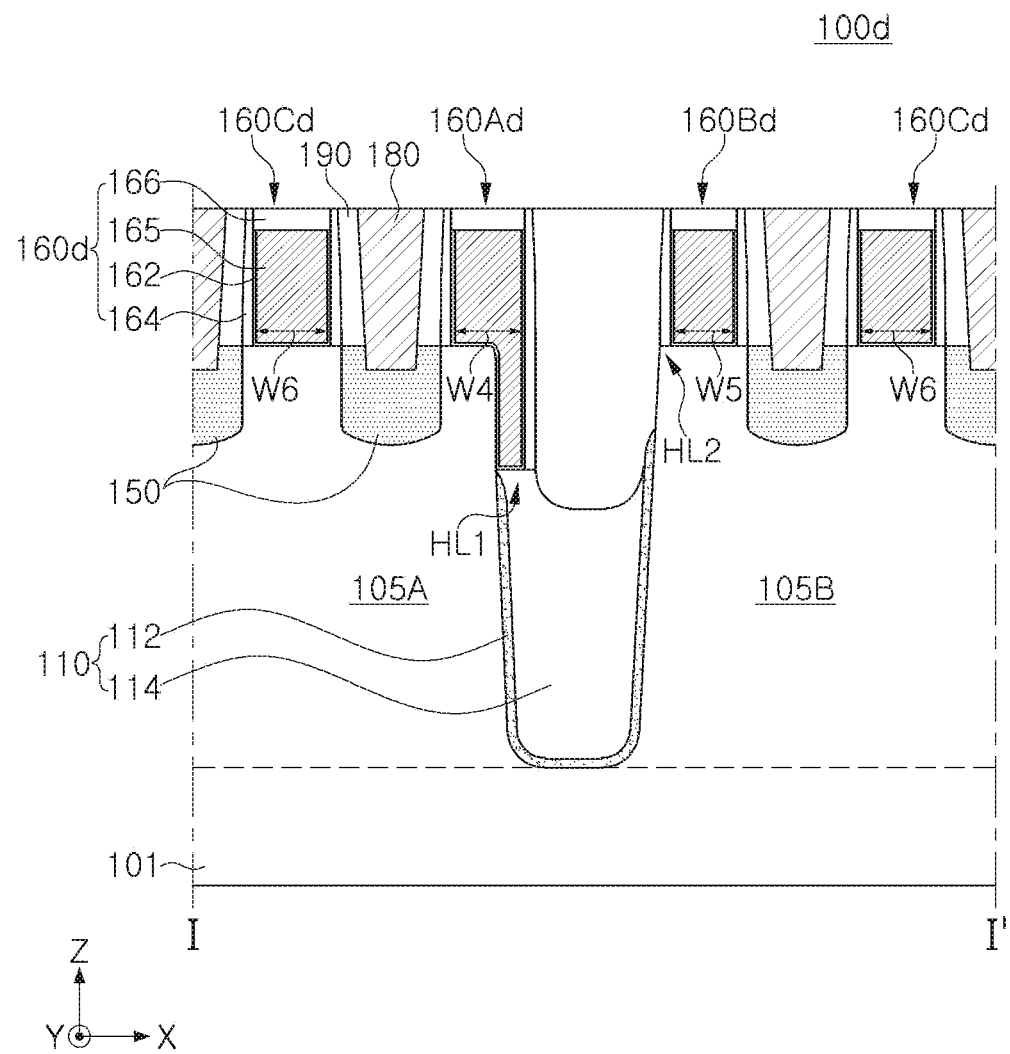
FIGS. 7A and 7B are cross-sectional views illustrating a semiconductor device according to some example embodiments.
Figure 7B:
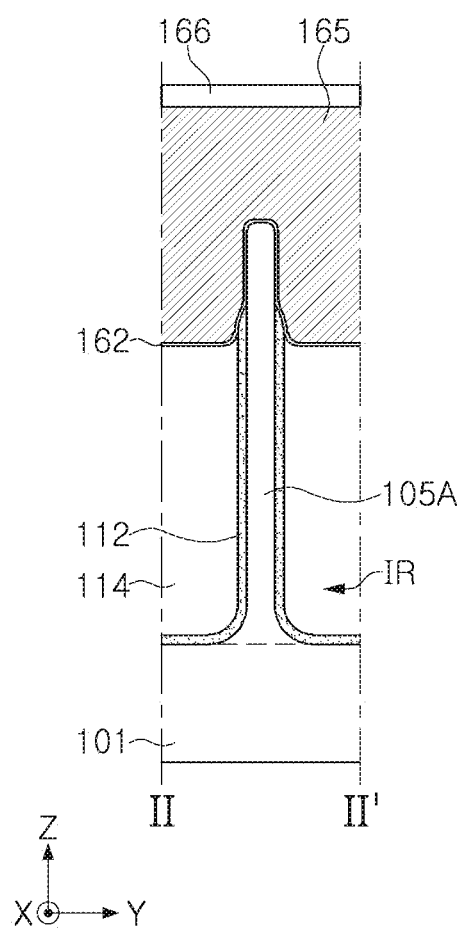

FIGS. 7A and 7B are cross-sectional views illustrating a semiconductor device according to some example embodiments. FIGS. 7A and 7B illustrate cross-sections corresponding to FIGS. 2A and 2B, respectively.

In some example embodiments, including the example embodiments illustrated in FIGS. 7A and 7B, and unlike some example embodiments, including the example embodiments illustrated in FIGS. 1 to 3, a semiconductor device 100d may not include channel structures 140, and shapes of gate structures 160d and an arrangement of a liner layer 112 may be different from that in the above embodiments. In the semiconductor device 100d, a channel region of transistors may be limited to the first and second active regions 105A and 105B having a fin structure. According to some example embodiments, the semiconductor device 100d may be additionally disposed in regions of semiconductor devices of other embodiments.

As illustrated in FIG. 7A, a first gate structure 160Ad and a second gate structure 160Bd may have an asymmetrical disposition with respect to a device isolation layer 110. A gate electrode 165 of the first gate structure 160Ad may have a fourth width W4 in the x direction, and a gate electrode 165 of the second gate structure 160Bd may have a fifth width W5, narrower than the fourth width W4 in the x direction. The fifth width W5 may be equal to or narrower than a sixth width W6 of a gate electrode 165 of a third gate structures 160Cd. The fourth width W4 may be equal to or narrower than the sixth width W6, but is not limited thereto. A relationship between relative widths of the gate electrodes 165 may be equally applied to widths of the first to third gate structures 160Ad, 160Bd, and 160Cd.

The gate electrode 165 of the first gate structure 160Ad may have a first region having a shape similar to a shape of the gate electrode 165 of the third gate structures 160Cd, and a second region continuously extending from an upper portion of the first gate structure 160Ad, and the first and second regions may be arranged to be adjacent to each other in the x direction. In the second region, the gate electrode 165 of the first gate structure 160Ad may extend along a lateral surface of the first active region 105A in a downward direction. In the second region, the gate electrode 165 of the first gate structure 160Ad may have a region protruding toward the device isolation layer 110 in a downward direction. Therefore, a lower end of the gate electrode 165 of the first gate structure 160Ad may be located on a first height level HL1, lower than a second height level HL2, which may be a height level of a lower end of the gate electrode 165 of the second gate structure 160Bd. In the first gate structure 160Ad, a gate spacer layer 164 adjacent to the device isolation layer 110 may extend along a lateral surface of the first active region 105A, may extend in a downward direction, and may be in contact with the device isolation layer 110. Therefore, the first gate structures 160Ad may have asymmetrical dispositions with respect to a center in the x direction.

The second gate structure 160Bd may have the same structure as or a structure similar to the third gate structure 160Cd. For example, the second gate structure 160Bd may differ only in width from the third gate structure 160Cd. According to some example embodiments, the second gate structure 160Bd may have a shape in which a portion of the gate spacer layer 164 and a portion of the gate electrode 165 protrude toward the device isolation layer 110.

An end portion of the liner layer 112 adjacent to the second gate structure 160Bd may be located on a height level spaced from an upper surface of the second active region 105B in a downward direction. In some example embodiments, upper portions of the first and second active regions 105A and 105B may be exposed to a predetermined height from the device isolation layer 110 including the liner layer 112 as described above. The height on which the first and second active regions 105A and 105B are exposed may be variously changed in some example embodiments. According to an arrangement of the liner layer 112, as illustrated in FIG. 7B, the gate electrode 165 have a region extending along the first active region 105A from the upper surface of the first active region 105A in a downward direction, and being then curved along the liner layer 112. Even in this case, in the device isolation layer 110, both upper end portions of the liner layer 112 may be located on different height levels in a cross-section in the x direction. An arrangement of the liner layer 112 may be applied to other embodiments.

Figure 8A:
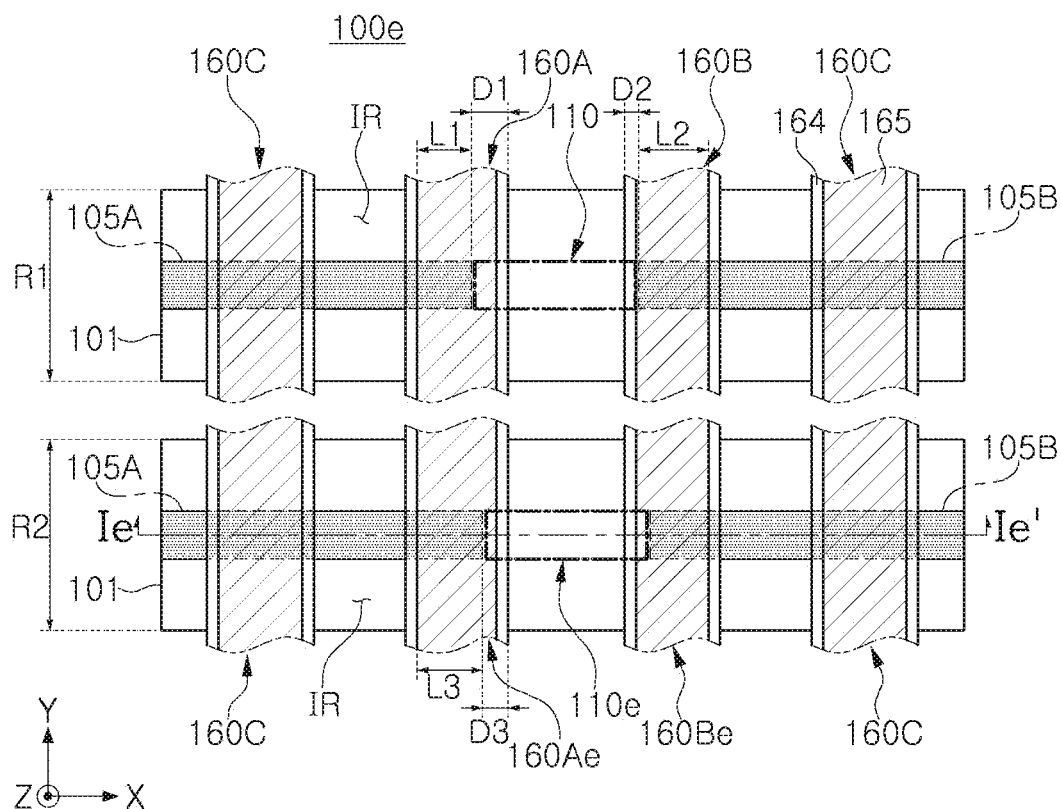
FIGS. 8A and 8B are plan and cross-sectional views illustrating a semiconductor device according to some example embodiments.
Figure 8B:
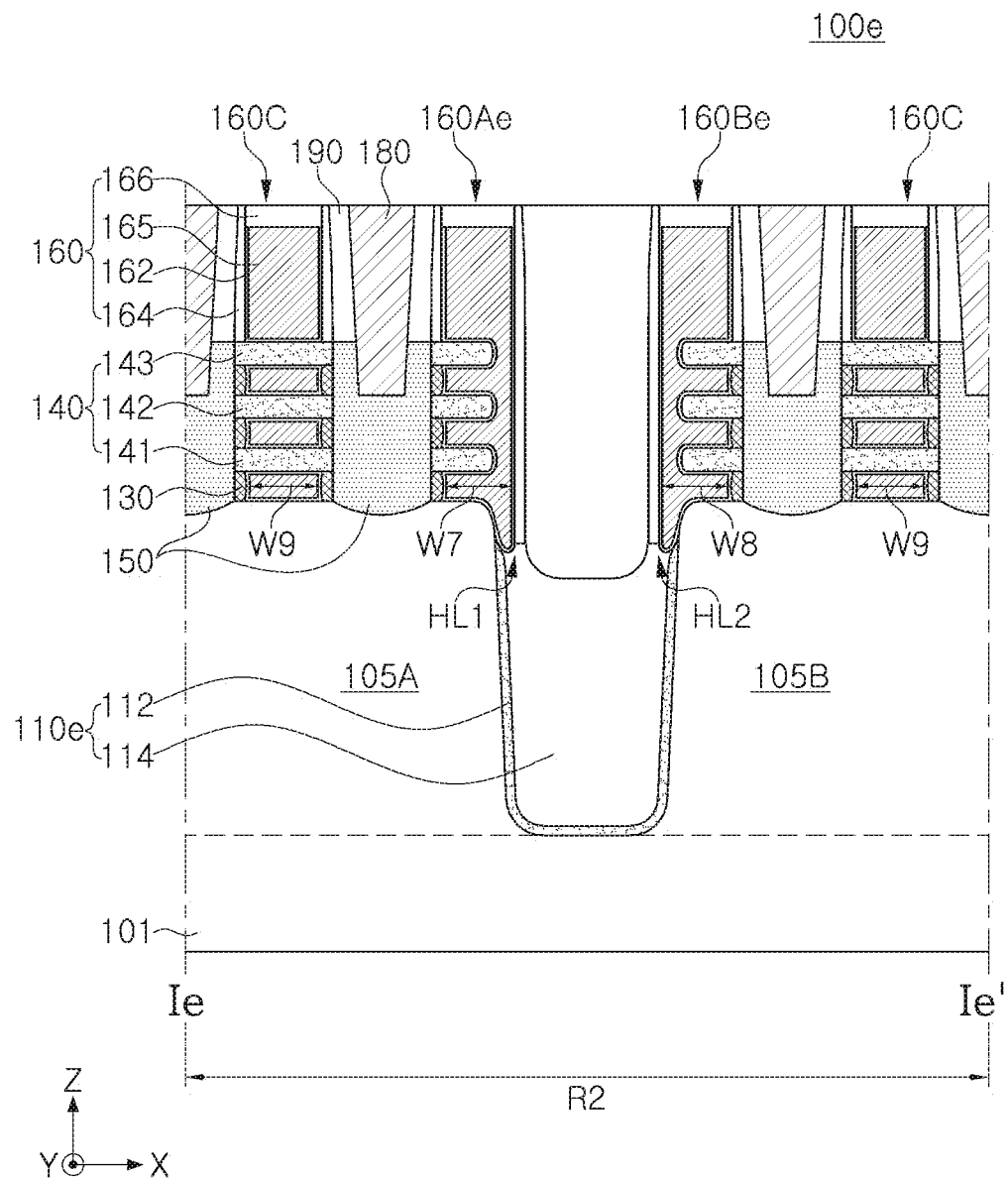

FIGS. 8A and 8B are plan and cross-sectional views illustrating a semiconductor device according to some example embodiments. FIG. 8B illustrates a cross-sectional view taken along the cut line Ie-Ie' of FIG. 8A.

Referring to FIGS. 8A and 8B, a semiconductor device 100e may have first and second regions R1 and R2. The first and second regions R1 and R2 may include first and second active regions 105A and 105B, respectively, channel structures 140, source/drain regions 150, and gate structures 160. The first region R1 may have the same cross-sectional structure as described with reference to FIG. 2A, and the description with reference to FIG. 2A may be applied in the same manner. The second region R2 may include first and second gate structures 160Ae and 160Be having a symmetrical shape with respect to a device isolation layer 110e, as illustrated in FIG. 8B.

The first and second gate structures 160Ae and 160Be may have substantially the same width intersecting each of the first and second active regions 105A and 105B. For example, a gate electrode 165 of each of the first and second gate structures 160Ae and 160Be may overlap each of the first and second active regions 105A and 105B by a third length L3 in the x direction. The third length L3 may be equal to or longer than a first length L1 of the first region RE The first and second gate structures 160Ae and 160Be may protrude from end portions of the first and second active regions 105A and 105B toward the device isolation layer 110e in the x direction by a third distance D3, respectively. The third distance D3 may be equal to or shorter than a first distance D1 of the first region R1.

As illustrated in FIG. 8A, the first gate structure 160Ae and the second gate structure 160Be may have a symmetrical shape with respect to the device isolation layer 110e. The gate electrode 165 of the first gate structure 160Ae may have a seventh width W7 in the x direction, and the gate electrode 165 of the second gate structure 160Be may have an eighth width W8 that may be substantially equal to the seventh width W7 in the x direction. The seventh width W7 and the eighth width W8 may be narrower than a ninth width W9 of a gate electrode 165 of each of third gate structures 160C, but are not limited thereto. A relationship between relative widths of the gate electrodes 165 may be equally applied to the widths of the first to third gate structures 160Ae, 160Be, and 160C.

The gate electrode 165 of the first gate structure 160Ae may have the same structure as or a structure similar to the first gate structure 160A in the first region R1, as described above with reference to FIG. 2A. For example, the first gate structure 160Ae may differ only in width from the first gate structure 160A in the first region R1. The gate electrode 165 of the second gate structure 160Be may have a structure symmetrical to the gate electrode 165 of the first gate structure 160Ae.

FIGS. 9A, 9B, 9C, 9D, 9E, 9F, 9G, and 9H are views illustrating a process sequence for explaining a method of manufacturing a semiconductor device according to some example embodiments. FIGS. 9A to 9H illustrate some example embodiments of a method for manufacturing the semiconductor device of FIGS. 1 to 3, and cross-sections corresponding to FIGS. 2A and 2B are illustrated together.

Figure 9A:
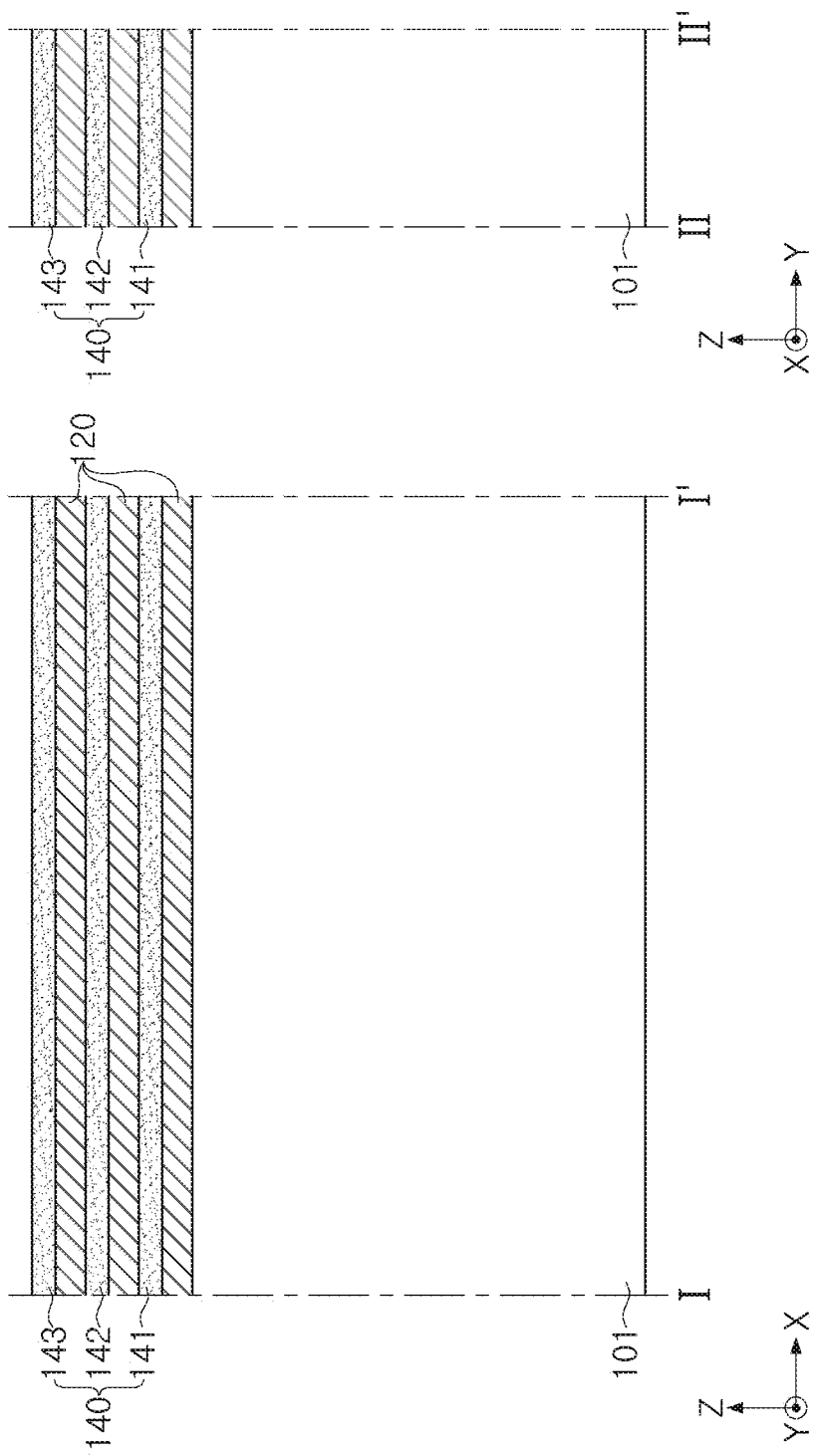
FIGS. 9A, 9B, 9C, 9D, 9E, 9F, 9G, and 9H are views illustrating a process sequence for explaining a method of manufacturing a semiconductor device according to some example embodiments.

Referring to FIG. 9A, sacrificial layers 120 and channel layers 141, 142, and 143 may be alternately stacked on a substrate 101.

The sacrificial layers 120 may be layers to be replaced with the gate dielectric layer 162 and the gate electrode 165, as illustrated in FIGS. 2A and 2B, by a subsequent process. The sacrificial layers 120 may be made of a material having etch selectivity with respect to the channel layers 141, 142, and 143, respectively. The channel layers 141, 142, and 143 may include a material different from the sacrificial layers 120. The sacrificial layers 120 and the channel layers 141, 142, and 143 may include, for example, a semiconductor material including at least one of silicon (Si), silicon germanium (SiGe), or germanium (Ge), but different materials may be included, and impurities may or may not be included. For example, the sacrificial layers 120 may include silicon germanium (SiGe), and the channel layers 141, 142, and 143 may include silicon (Si).

The sacrificial layers 120 and the channel layers 141, 142, and 143 may be formed by performing an epitaxial growth process on the substrate 101. Each of the sacrificial layers 120 and the channel layers 141, 142, and 143 may have a thickness of about 1 Å to about 100 nm. The number of layers of the channel layers 141, 142, and 143 alternately stacked with the sacrificial layers 120 may be variously changed in some example embodiments.

Figure 9B:
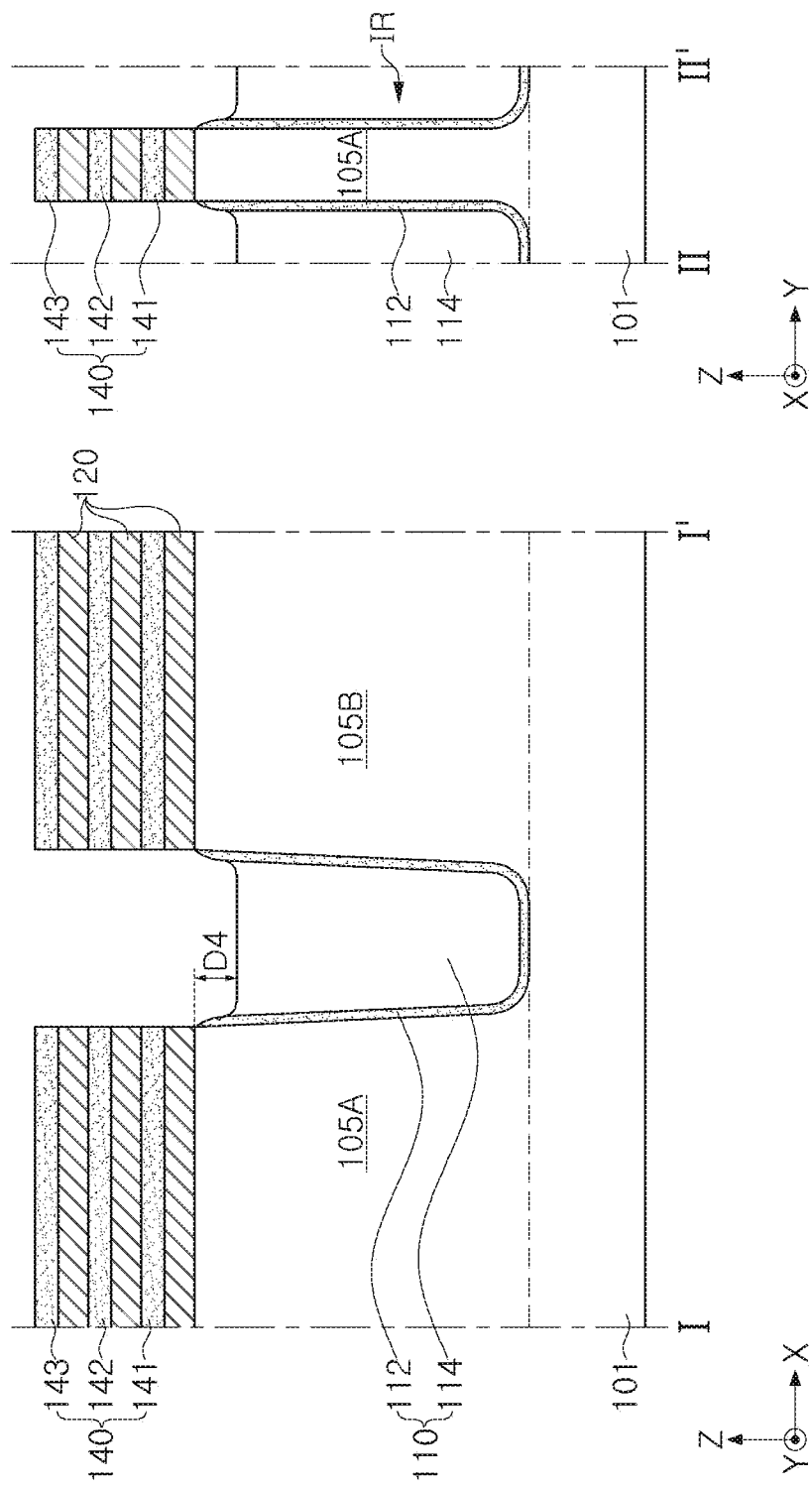

Referring to FIG. 9B, the sacrificial layers 120, the channel layers 141, 142, and 143, and a portion of the substrate 101 may be removed to form active structures and a device isolation region IR may be formed.

The active structures may include the sacrificial layers 120 and the channel layers 141, 142, and 143 that may be alternately stacked with each other, and may further include first and second active regions 105A and 105B protruding from the substrate 101 by removing a portion of the substrate 101. The active structures may be formed in a linear shape extending in one direction, for example, in the x direction, and may be arranged to be spaced apart from each other in the y direction.

A liner layer 112 and an isolation insulating layer 114 may be sequentially stacked in a trench region from which a portion of the substrate 101 is removed. Next, the liner layer 112 and the isolation insulating layer 114 may be partially removed to, at least, expose upper surfaces of the first and second active regions 105A and 105B, to form a device isolation region IR including a device isolation layer 110. In the device isolation region IR, an upper surface of the isolation insulating layer 114 may be, at least, formed on a lower height level than the upper surfaces of the first and second active regions 105A and 105B by a predetermined depth D4. The depth D4 may be variously changed in some example embodiments. The liner layer 112 may protrude from the upper surface of the isolation insulating layer 114 in an upward direction, and may remain, but is not limited thereto. Depending on materials of the liner layer 112 and the isolation insulating layer 114, removal process conditions, or the like, an upper surface of the liner layer 112 may also have a height level similar to a height level of the isolation insulating layer 114. In this operation, when the liner layer 112 is formed, for example, when the substrate 101 is nitrided using a nitridation process to form the liner layer 112, corners of the first and second active regions 105A and 105B may be formed to have a rounded shape.

Figure 9C:
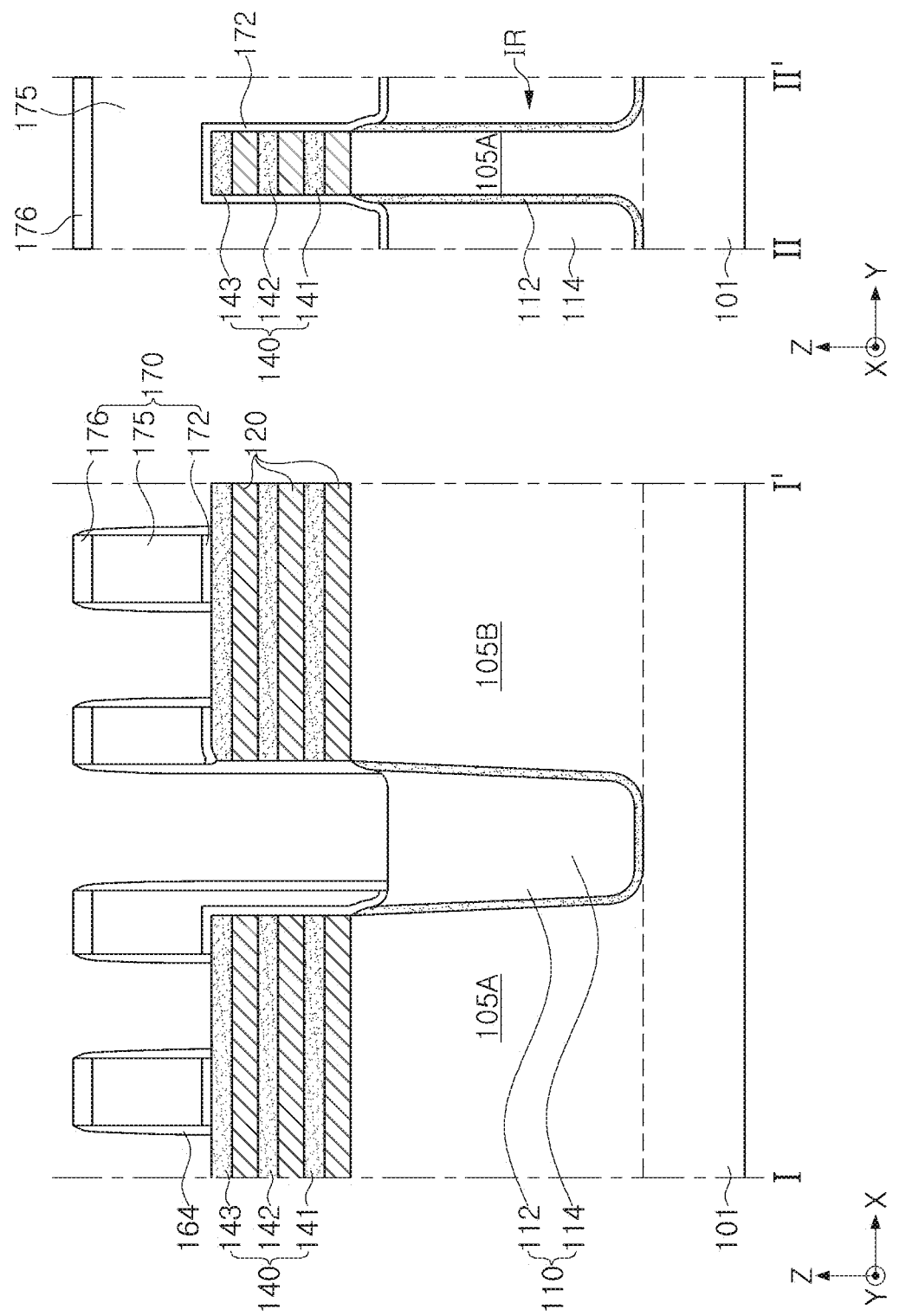

Referring to FIG. 9C, sacrificial gate structures 170 and gate spacer layers 164 may be formed on the active structures.

The sacrificial gate structures 170 may be sacrificial structures formed in a region in which the gate dielectric layer 162 and the gate electrode 165 are arranged on the channel structures 140 by a subsequent process, as illustrated in FIGS. 2A and 2B. The sacrificial gate structure 170 may include first and second sacrificial gate layers 172 and 175, and a mask pattern layer 176, sequentially stacked. The first and second sacrificial gate layers 172 and 175 may be patterned using the mask pattern layer 176. The first and second sacrificial gate layers 172 and 175 may be an insulating layer and a conductive layer, respectively, but are not limited thereto, and the first and second sacrificial gate layers 172 and 175 may be formed as a single layer. For example, the first sacrificial gate layer 172 may include a silicon oxide, and the second sacrificial gate layer 175 may include polysilicon. The mask pattern layer 176 may include a silicon oxide and/or a silicon nitride. The sacrificial gate structures 170 may intersect the active structures to have a linear shape extending in one direction. The sacrificial gate structures 170 may extend in the y direction, for example, and may be disposed to be spaced apart from each other in the x direction.

The gate spacer layers 164 may be formed on both sidewalls of the sacrificial gate structures 170. The gate spacer layers 164 may be prepared by forming a film having a uniform thickness along upper and lateral surfaces of the sacrificial gate structures 170 and the active structures, and performing then an anisotropic etching process. The gate spacer layers 164 may be made of a low dielectric constant material, and may include, for example, at least one of SiO, SiN, SiCN, SiOC, SiON, or SiOCN.

In this operation, the sacrificial gate structures 170 adjacent to the device isolation layer 110 may be formed to have a partially extended shape onto the device isolation layer 110 or have a partially inclined shape along an end portion of the active structure. In addition, the gate spacer layers 164 on sidewalls of the sacrificial gate structures 170 may extend in a downward direction to contact the device isolation layer 110.

Figure 9D:
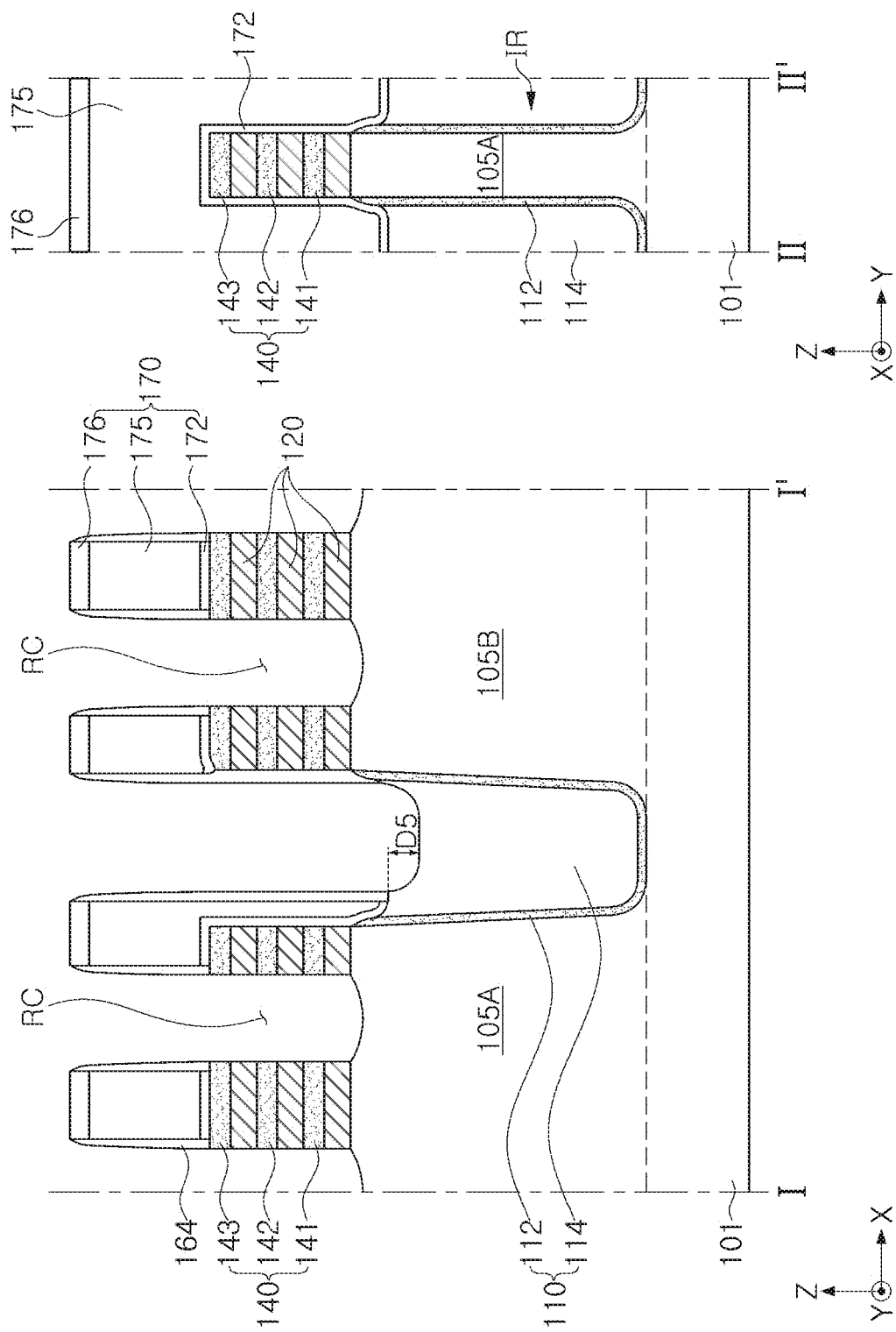

Referring to FIG. 9D, exposed sacrificial layers 120 and the channel layers 141, 142, and 143 may be removed to form recess regions RC between the sacrificial gate structures 170.

The exposed sacrificial layers 120 and the channel layers 141, 142, and 143 may be removed by using the sacrificial gate structures 170 and the gate spacer layers 164 as masks. Therefore, the channel layers 141, 142, and 143 may form a channel structure 140 having a limited length in the x direction. According to some example embodiments, below the sacrificial gate structures 170, the sacrificial layers 120 and the channel structure 140 may be partially removed from lateral surfaces thereof in a medial direction, to locate both lateral surfaces of the sacrificial layers 120 and the channel structure 140 in the x direction below the sacrificial gate structures 170 and the gate spacer layers 164.

In this operation, when forming the recess regions RC, an upper portion of the device isolation layer 110 may be additionally recessed to a predetermined depth D5. The depth D5 may be variously changed in some example embodiments.

Figure 9E:
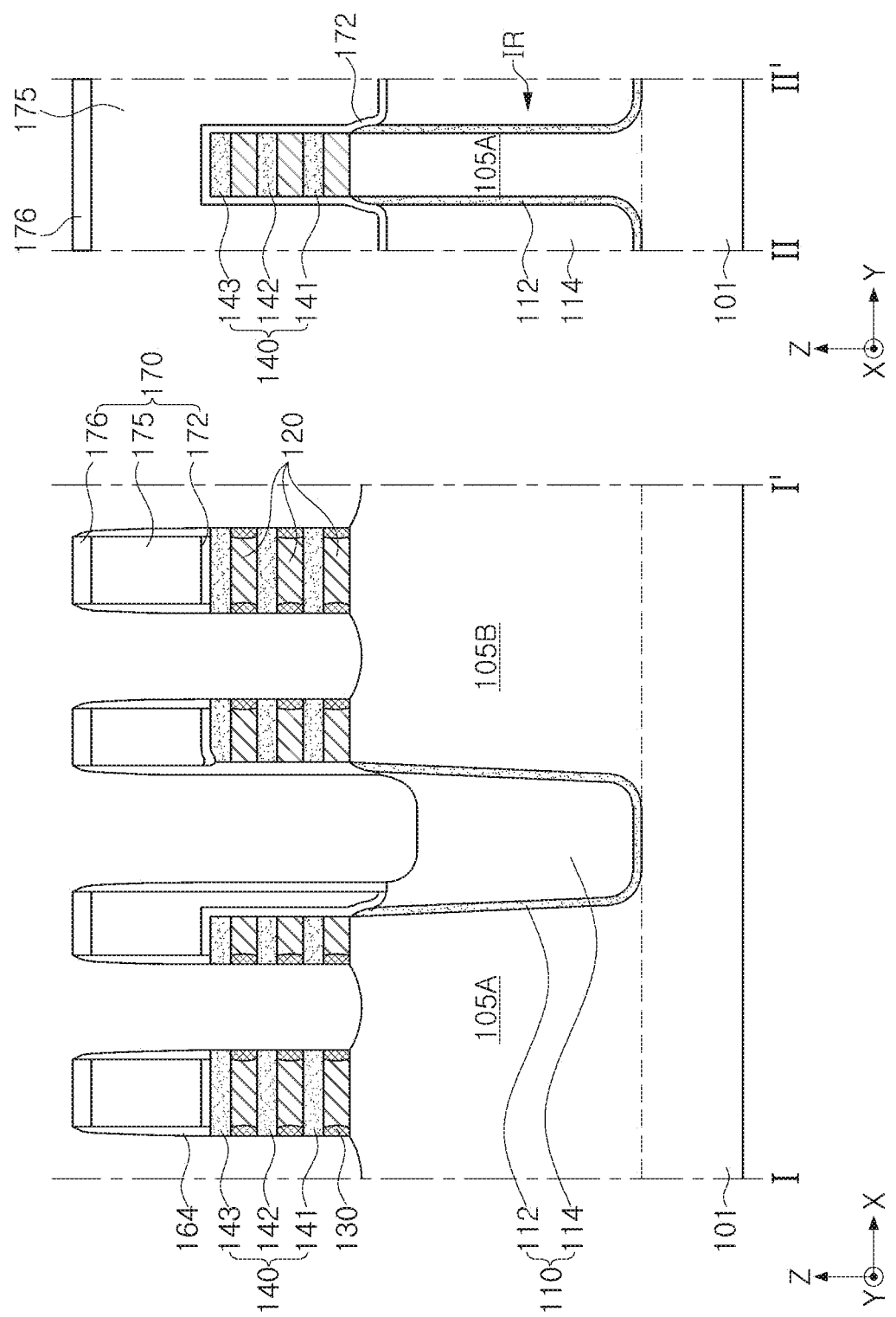

Referring to FIG. 9E, the exposed sacrificial layers 120 may be partially removed from lateral surfaces thereof in a medial direction, and internal spacer layers 130 may be formed in regions from which the sacrificial layers 120 have been removed.

The sacrificial layers 120 may be selectively etched with respect to the channel structures 140 by, for example, a wet etching process, to be removed from the lateral surface thereof in the x direction to a predetermined depth. The sacrificial layers 120 may have lateral surfaces that are medially concave by the lateral etching operation as described above. Shapes of the lateral surfaces of the sacrificial layers 120 are not limited to those illustrated.

The internal spacer layers 130 may be prepared by filling an insulating material in regions from which the sacrificial layers 120 have been removed, and removing the insulating material deposited on an outside of the channel structures 140. The internal spacer layers 130 may be formed of the same material as the gate spacer layers 164, but are not limited thereto. For example, the internal spacer layers 130 may include at least one of SiN, SiCN, SiOCN, SiBCN, or SiBN.

Figure 9F:
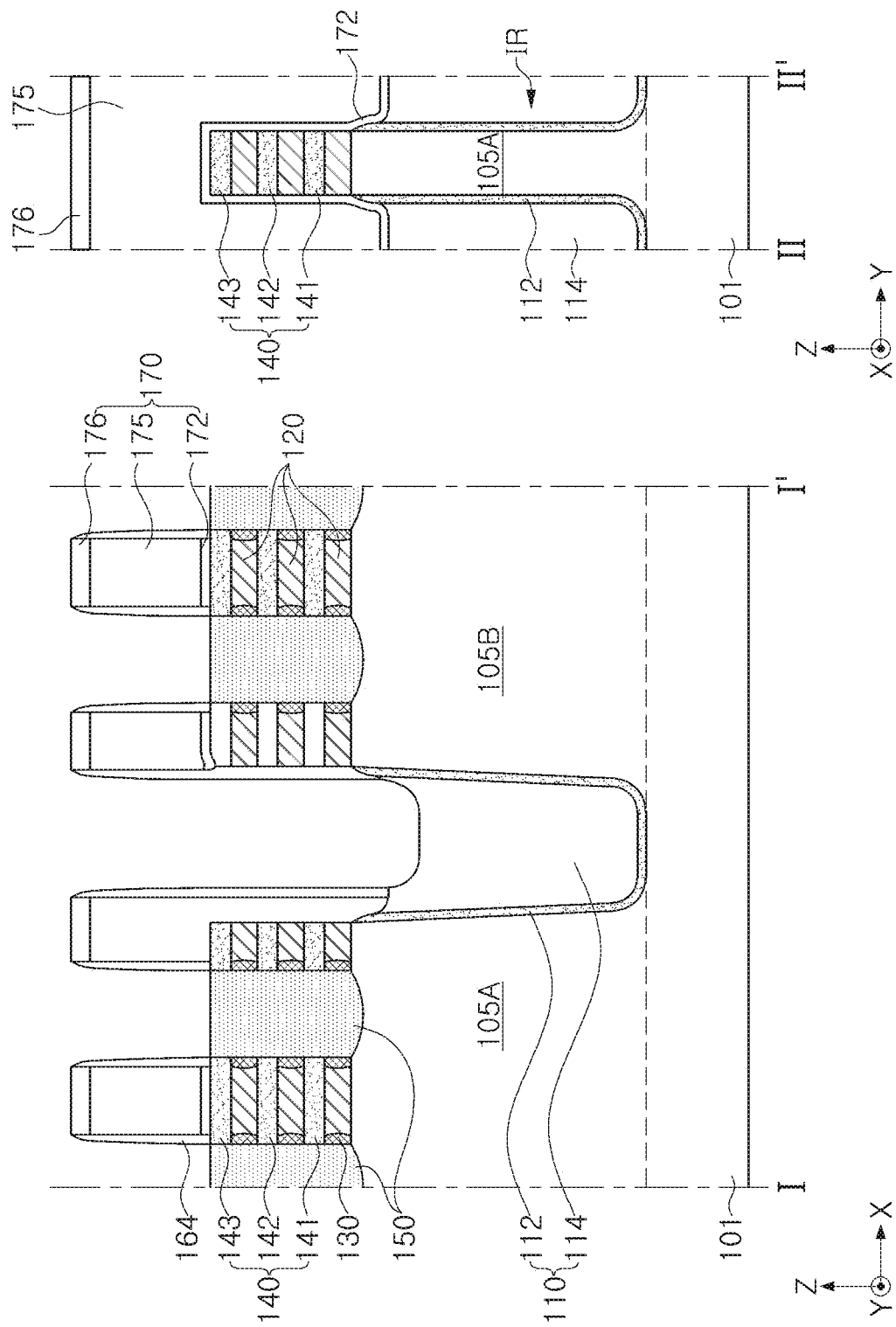

Referring to FIG. 9F, on both sides of the sacrificial gate structures 170, source/drain regions 150 may be formed in the recess region RC.

The source/drain regions 150 may be formed on the lateral surfaces of the first to third channel layers 141, 142, and 143, and on the first and second active regions 105A and 105B on a bottom surface of the recess region RC, by a selective epitaxial growth process. The source/drain regions 150 may include impurities by an in-situ doping process, and may include a plurality of layers having different doping elements and/or different doping concentrations.

Figure 9G:
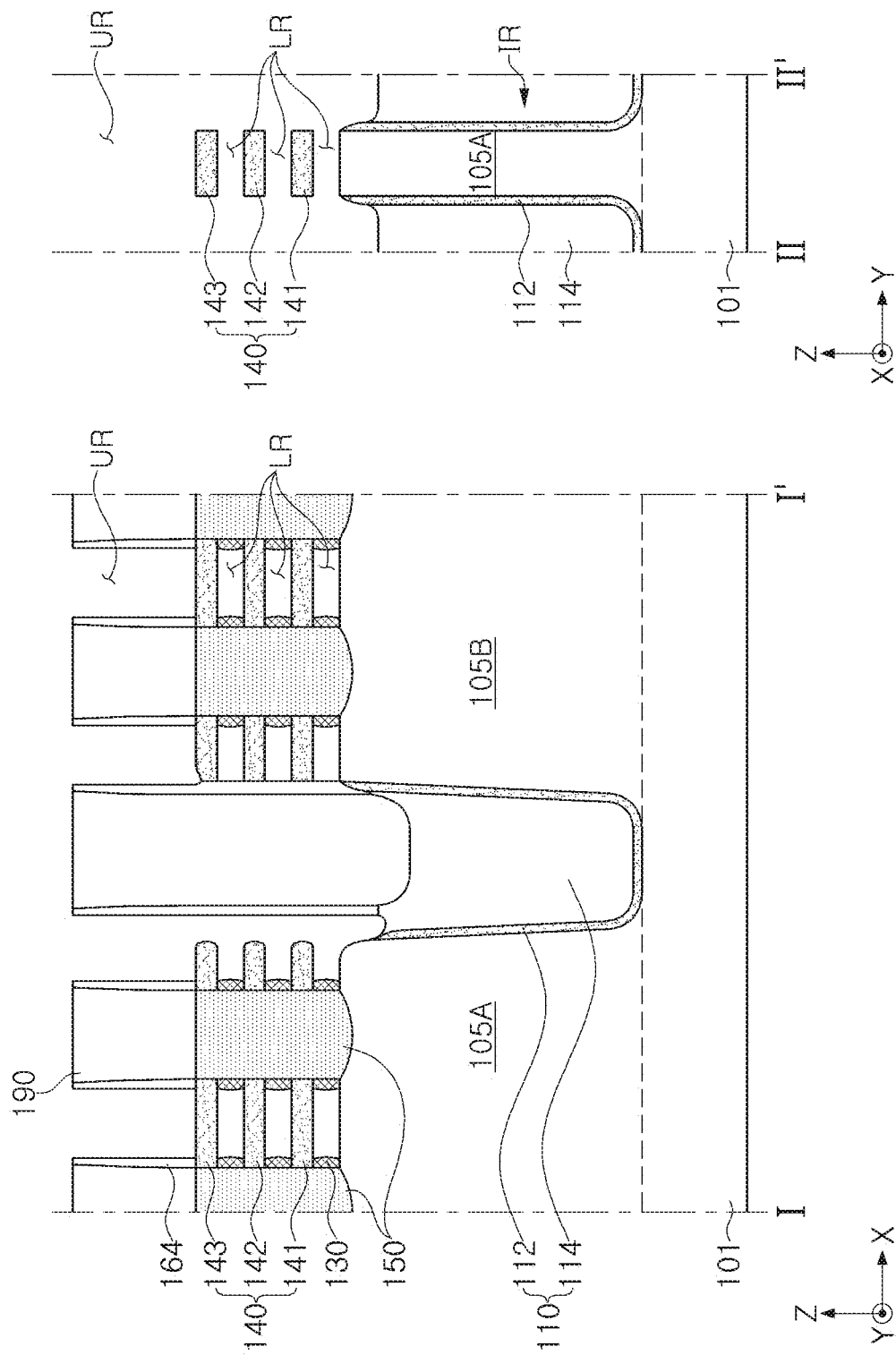

Referring to FIG. 9G, an interlayer insulating layer 190 may be formed, and the sacrificial layers 120 and the sacrificial gate structures 170 may be removed.

The interlayer insulating layer 190 may be prepared by forming an insulating film covering the sacrificial gate structures 170 and the source/drain regions 150, and performing a planarization process.

The sacrificial layers 120 and the sacrificial gate structures 170 may be selectively removed with respect to the gate spacer layers 164, the interlayer insulating layer 190, and the channel structures 140. First, the sacrificial gate structures 170 may be removed to form upper gap regions UR, and then the sacrificial layers 120 exposed through the upper gap regions UR may be removed to form lower gap regions LR. For example, when the sacrificial layers 120 include silicon germanium (SiGe) and the channel structures 140 include silicon (Si), the sacrificial layers 120 may be selectively removed by performing a wet etching process using peracetic acid as an etchant. During the removal, the source/drain regions 150 may be protected by the interlayer insulating layer 190 and the internal spacer layers 130.

In this operation, when the sacrificial layers 120 and the sacrificial gate structures 170 are removed, a portion of the device isolation layer 110 including the liner layer 112 at a corner of the first active region 105A may be removed together.

Figure 9H:
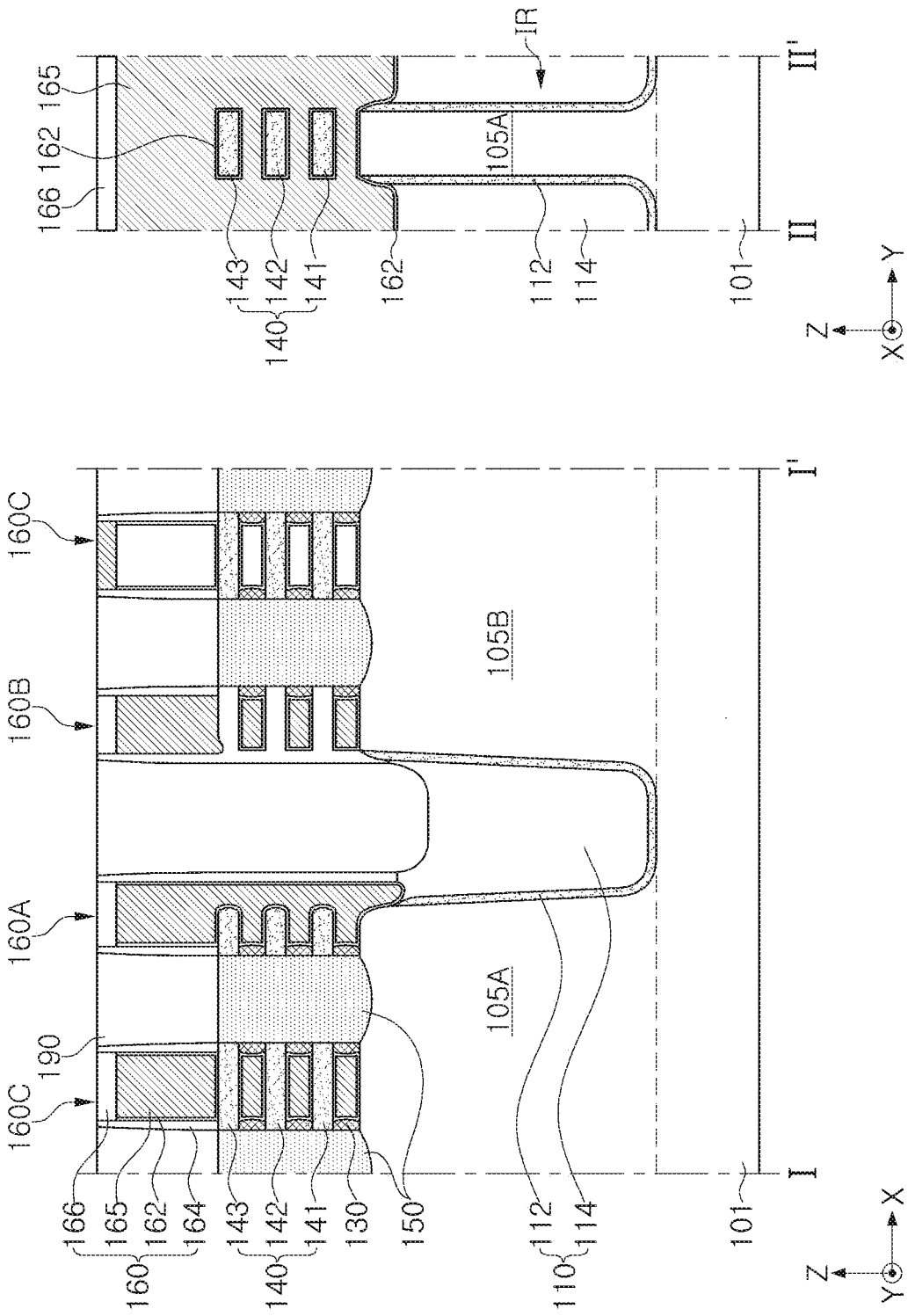

Referring to FIG. 9H, gate structures 160 may be formed in the upper gap regions UR and the lower gap regions LR.

Gate dielectric layers 162 may be formed to conformally cover inner surfaces of the upper gap regions UR and the lower gap regions LR. After forming gate electrodes 165 to completely fill the upper and lower gap regions UR and LR, portions of the gate electrodes 165 may be removed from an upper portion of the upper gap regions UR to a predetermined depth. A gate capping layer 166 may be formed in regions in which the portions of the gate electrodes 165 have removed from the upper gap regions UR. A shape and a thickness of the gate capping layer 166 may be variously changed in some example embodiments. Therefore, gate structures 160 including the gate dielectric layer 162, the gate electrode 165, the gate spacer layers 164, and the gate capping layer 166 may be formed.

Next, referring to FIGS. 2A and 2B together, a contact plug 180 may be formed.

First, the interlayer insulating layer 190 may be patterned to form a contact hole, and a conductive material may be filled in the contact hole to form the contact plug 180. A lower surface of the contact hole may be recessed into the source/drain regions 150 or may have a bend along upper surfaces of the source/drain regions 150. In some example embodiments, a shape and an arrangement of the contact plug 180 may be variously changed.

A semiconductor device having improved reliability may be provided by including gate structures having an asymmetric shape (e.g., asymmetrical disposition) as described herein and disposed adjacent to each other with a device isolation layer interposed therebetween.

Various advantages and effects of the present inventive concepts are not limited to the above-described contents, and can be more easily understood in the course of describing specific embodiments of the present inventive concepts.

While example embodiments have been illustrated and described above, it will be apparent to those skilled in the art that modifications and variations could be made without departing from the scope of the present inventive concepts as defined by the appended claims.

What is claimed is:

1. A semiconductor device, comprising:
a substrate including first and second active regions extending in a first direction and isolated from direct contact with each other in the first direction;
a device isolation layer in a trench region of the substrate between the first and second active regions;
a plurality of channel layers on the first and second active regions, respectively, and isolated from direct contact with each other in a vertical direction perpendicular to the first direction;
a plurality of gate spacer layers;
gate structures extending in a second direction on the substrate and intersecting the first and second active regions and the plurality of channel layers, each of the gate structures including a gate electrode surrounding the plurality of channel layers, the second direction being different from the first direction, the first direction and the second direction both being parallel to an upper surface of the substrate;
source/drain regions on the first and second active regions on at least one side of each of the gate structures, and contacting the plurality of channel layers; and
contact plugs connected to the source/drain regions, wherein
the gate structures include first and second gate structures respectively intersecting end portions of the first and second active regions contacting the device isolation layer, the first gate structure including a first gate electrode, the second gate structure including a second gate electrode,
the first gate electrode has a shape in which the first gate electrode includes first regions isolated from direct contact with each other in the vertical direction by the plurality of channel layers and a second region extending continuously on the plurality of channel layers in the vertical direction, the first regions connected to the second region in the first direction,
the second gate electrode has a shape in which the second gate electrode includes third regions isolated from direct contact with each other in the vertical direction by the plurality of channel layers and a fourth region extending continuously on the plurality of channel layers in the vertical direction, the third regions connected to the fourth region in the first direction,
a first gate spacer layer of the plurality of gate spacer layers extends along a lateral surface of the second region,
a second gate spacer layer of the plurality of gate spacer layers extends along a lateral surface of the fourth region, and
lower ends of the second and fourth regions are at a lower level in the vertical direction than lower ends of the first and second gate spacer layers.

2. The semiconductor device of claim 1, wherein the lower end of the second region and the lower end of the fourth region protrude toward the device isolation layer.

3. The semiconductor device of claim 1, wherein
the lower end of the second region is on a level lower than a level of a lowermost end of the first regions, and
the lower end of the fourth region is on a level lower than a level of a lowermost end of the third regions.

4. The semiconductor device of claim 1, wherein the first gate structure and the second gate structure have a symmetrical disposition with respect to the device isolation layer, such that first gate structure and the second gate structure have reflective symmetry with respect to each other in the first direction.

5. The semiconductor device of claim 1, wherein first and second gate structures cover ends of the first and second active regions in the first direction, respectively, in a plan view.

6. The semiconductor device of claim 5, wherein the ends of the first and second active regions face each other in the first direction, in the plan view.

7. The semiconductor device of claim 1, wherein the first gate electrode has a first width in the first direction, and the second gate electrode has a second width in the first direction, the second width substantially equal to the first width in the first direction.

8. The semiconductor device of claim 7, wherein
the gate structures further comprise a third gate structure isolated from direct contact with the device isolation layer and including a third gate electrode, and
the third gate electrode has a third width in the first direction, the third width wider than the second width in the first direction.

9. The semiconductor device of claim 1, wherein the device isolation layer has a symmetrical disposition with respect to a center of the device isolation layer in the first direction such that the device isolation layer has reflective symmetry in the first direction.

10. The semiconductor device of claim 1, wherein the first gate electrode overlaps the first active region in a region having a length of about 30% to about 80% of an entire width of the first gate electrode in the first direction.

11. A semiconductor device, comprising:
a substrate including first and second active regions extending in a first direction and isolated from direct contact with each other in the first direction;
a device isolation layer between the first and second active regions in the substrate;
at least one gate spacer layer;
first and second gate structures extending in a second direction on the substrate while respectively intersecting end portions of the first and second active regions, the first gate structure including a first gate electrode, the second gate structure including a second gate electrode, the second direction being different from the first direction, the first direction and the second direction both being parallel to an upper surface of the substrate; and
a plurality of channel layers on the first and second active regions, respectively, isolated from direct contact with each other in a vertical direction, and surrounded by the first and second gate electrodes, wherein
the first gate electrode has a shape in which the first gate electrode includes first regions isolated from direct contact with each other in the vertical direction by the plurality of channel layers and a second region extending continuously on the plurality of channel layers in the vertical direction, the first regions connected to the second region in the first direction,
the first gate structure and the second gate structure have a symmetrical disposition with respect to the device isolation layer, such that first gate structure and the second gate structure have reflective symmetry with respect to each other in the first direction,
the at least one gate spacer layer extends along a lateral surface of the second region, and
a lower end of the second region is at a lower level in the vertical direction than a lower end of the at least one gate spacer layer.

12. The semiconductor device of claim 11, wherein the lower end of the second region is on a level lower than a level of a lowermost end of the first regions.

13. The semiconductor device of claim 11, wherein the first gate structure contacts the device isolation layer at a lowermost end of the first gate structure.

14. The semiconductor device of claim 13, wherein the lowermost end of the first gate structure recesses the device isolation layer such that the first gate structure protrudes toward the device isolation layer.

15. The semiconductor device of claim 11, wherein the second gate electrode has a shape in which the second gate electrode includes third regions isolated from direct contact with each other in the vertical direction by the plurality of channel layers and a fourth region extending continuously on the plurality of channel layers in the vertical direction, the third regions connected to the fourth region in the first direction.

16. The semiconductor device of claim 15, wherein a lower end of the fourth region is on a level lower than a level of a lowermost end of the third regions.

17. A semiconductor device, comprising:
a substrate including first and second active regions extending in a first direction and isolated from direct contact with each other in the first direction;
a device isolation layer between the first and second active regions in the substrate;
at least one gate spacer layer;
first and second gate structures extending in a second direction on the substrate while respectively intersecting end portions of the first and second active regions, the first gate structure including a first gate electrode, the second gate structure including a second gate electrode, the second direction being different from the first direction, the first direction and the second direction both being parallel to an upper surface of the substrate;
a third gate structure isolated from direct contact with the device isolation layer and including a third gate electrode; and
a plurality of channel layers on the first and second active regions, respectively, isolated from direct contact with each other in a vertical direction, and surrounded by the first to third gate electrodes, wherein
the first gate electrode has a first region having regions isolated from direct contact with each other in the vertical direction with the plurality of channel layers interposed therebetween, and a second region continuously extending in the vertical direction, the regions of the first region connected to the second region in the first direction,
wherein the third gate structure has a shape, different from a shape of the first and second gate structures, and
the at least one gate spacer layer extends along a lateral surface of the second region, and
a lower end of the second region is at a lower level in the vertical direction than a lower end of the at least one gate spacer layer.

18. The semiconductor device of claim 17, wherein a lower end of the first gate structure is on a level lower than a level of a lower end of the third gate structure.

19. The semiconductor device of claim 17, wherein the first and second gate structures protrude toward the device isolation layer and contact the device isolation layer.

20. The semiconductor device of claim 17, wherein the first gate structure and the second gate structure have a symmetrical disposition with respect to the device isolation layer, such that first gate structure and the second gate structure have reflective symmetry with respect to each other in the first direction.

* * * * *